United States Patent
Koshimizu

(10) Patent No.: US 8,741,095 B2
(45) Date of Patent: Jun. 3, 2014

(54) PLASMA PROCESSING APPARATUS, PLASMA PROCESSING METHOD, AND COMPUTER READABLE STORAGE MEDIUM

(75) Inventor: Chishio Koshimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1322 days.

(21) Appl. No.: 12/415,466

(22) Filed: Mar. 31, 2009

(65) Prior Publication Data

US 2009/0255800 A1   Oct. 15, 2009

Related U.S. Application Data

(60) Provisional application No. 61/109,954, filed on Oct. 31, 2008.

(30) Foreign Application Priority Data

Mar. 31, 2008   (JP) ................................. 2008-089888

(51) Int. Cl.
  *C23C 16/509*   (2006.01)
  *H01L 21/3065*   (2006.01)
  *C23F 1/00*   (2006.01)

(52) U.S. Cl.
  USPC .............. 156/345.28; 118/723 R; 118/723 E; 118/723 I; 156/345.24; 156/345.43; 156/345.44; 156/345.47; 156/345.48

(58) Field of Classification Search
  USPC ......... 118/723 E, 723 R; 156/345.24–345.34, 156/345.43, 345.44, 345.47
  See application file for complete search history.

(56) References Cited

U.S. PATENT DOCUMENTS 5,424,691 A * 6/1995 Sadinsky ..................... 333/17.3
5,936,481 A * 8/1999 Fujii ............................ 333/17.3
5,997,687 A * 12/1999 Koshimizu ............... 156/345.44

(Continued)

FOREIGN PATENT DOCUMENTS

JP   08096992 A  *  4/1996
JP   10-64696        3/1998

(Continued)

OTHER PUBLICATIONS

Office Action issued Jan. 24, 2011, in Korean Patent Application No. 10-2009-0027886 wiith English translation.
Office Action issued Jul. 20, 2010, in Chinese Patent Application No. 200910129589.4 with English translation.

*Primary Examiner* — Rakesh Dhingra
*Assistant Examiner* — Benjamin Kendall
(74) *Attorney, Agent, or Firm* — Rothwell, Figg, Ernst & Manbeck, P.C.

(57) ABSTRACT

A plasma processing apparatus includes a vacuum evacuable processing chamber; a first electrode for supporting a substrate to be processed in the processing chamber; a processing gas supply unit for supplying a processing gas into a processing space; a plasma excitation unit for generating a plasma by exciting the processing gas in the processing chamber; a first radio frequency power supply unit for supplying a first radio frequency power to the first electrode to attract ions in the plasma to the substrate; and a first radio frequency power amplitude modulation unit for modulating an amplitude of the first radio frequency power at a predetermined interval. The plasma processing apparatus further includes a first radio frequency power frequency modulation unit for modulating a frequency of the first radio frequency power in substantially synchronously with the amplitude modulation of the first radio frequency power.

9 Claims, 17 Drawing Sheets

(56) References Cited

U.S. PATENT DOCUMENTS

| | | |
|---|---|---|
| 6,624,084 B2 | 9/2003 | Maeda et al. |
| 6,726,804 B2 * | 4/2004 | Wang et al. ............. 156/345.44 |
| 7,740,737 B2 * | 6/2010 | Koshiishi et al. ........ 156/345.44 |
| 2003/0079983 A1 * | 5/2003 | Long et al. .................... 204/164 |
| 2003/0196601 A1 * | 10/2003 | Murayama et al. ....... 118/723 E |
| 2005/0241762 A1 * | 11/2005 | Paterson et al. .......... 156/345.28 |
| 2007/0218681 A1 | 9/2007 | Yoshida |

FOREIGN PATENT DOCUMENTS

| | | |
|---|---|---|
| JP | 10321601 | * 12/1998 |
| JP | 10321601 A | * 12/1998 |
| JP | 2001-185542 | 7/2001 |
| KR | 10-2007-0094476 | 9/2007 |

* cited by examiner

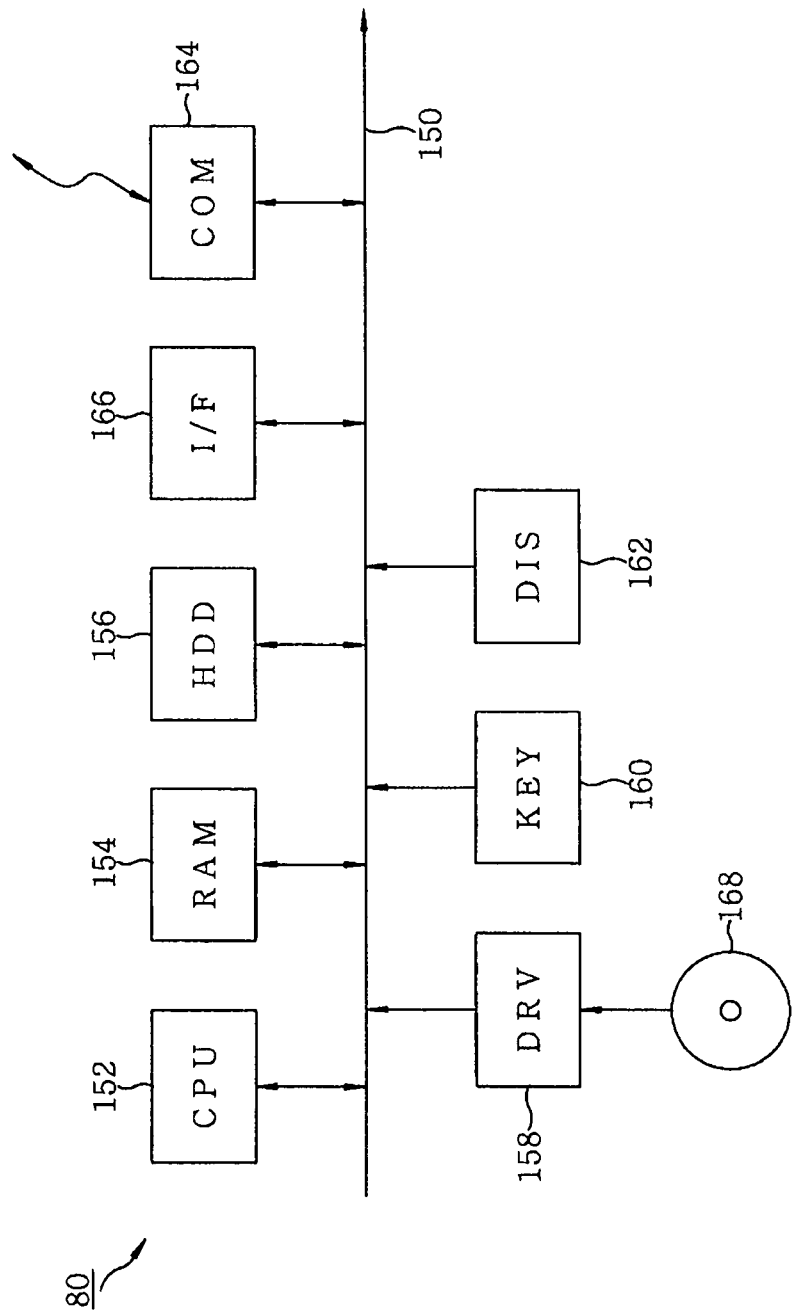

PLASMA PROCESSING APPARATUS, PLASMA PROCESSING METHOD, AND COMPUTER READABLE STORAGE MEDIUM

FIELD OF THE INVENTION

The present invention relates to a technique for performing plasma processing on a substrate to be processed; and, more particularly, to a plasma processing apparatus and a plasma processing method in which an amplitude of a radio frequency power used for plasma processing is modulated at a regular interval.

BACKGROUND OF THE INVENTION

In a manufacturing process of a semiconductor device or an FPD (Flat Panel Display), a plasma is often used in a process such as etching, deposition, oxidation, sputtering or the like to make a processing gas efficiently react even at a relatively low temperature.

With a recent trend of scaling down of design rules for the manufacturing process, it is required in plasma etching a very high dimension accuracy and, also, improvement in in-plane uniformity and etching selectivity to a base or a mask. Thus, pressure in a processing region in a chamber tends to be getting lowered and ion energy is also tends to be lowered. To this end, a radio frequency power of a comparatively radio frequency (40 MHz or greater) that is much higher than a conventional frequency is used for plasma generation (radio frequency discharge). Further, a radio frequency power of a comparatively low frequency (13.56 MHz or less in general) is often supplied to an electrode for mounting thereon a substrate in order to more accurately control the energy of an ion (bias) to be attracted from the plasma to the substrate.

However, as the pressure in the processing region and the energy of the ion are getting lowered, charging damage cannot be ignored anymore, contrary to a conventional case. Namely, in a conventional apparatus where high energy ions are used, non-uniformity of a plasma potential in a surface to be processed does not cause serious problem. However, if the ion energy is low while the pressure is also low, the non-uniformity of the plasma potential in the surface leads to a breakdown in a gate oxide film by accumulated charges thereon. In other words, the charging damage occurs easily.

To that end, Patent Document 1 discloses therein a radio frequency current path correcting method in which a portion of current path, near an outer periphery of the wafer among radio frequency current paths formed by a radio frequency bias applied to the wafer, is made to direct upwardly toward a portion of surface of an opposing electrode which is projected from the outer periphery of the wafer. The patent Document 1 further discloses an impedance adjusting method in which an impedance to the ground with respect to the radio frequency bias is adjusted to be substantially constant in the whole wafer surface. Accordingly, a uniformity of a self-bias across the wafer generated by an application of the radio frequency bias to the wafer increases, and micro-damage is suppressed.

[Patent Document 1] Japanese Patent Laid-open Publication No. 2001-185542

However, the techniques described in Patent Document 1 are disadvantageous in that the presence of the current path correcting unit or the impedance adjusting unit makes the apparatus configuration complex, and also in that the in-plane uniformity of plasma processing is not sufficient.

Further, during the plasma processing, a gate oxide film is charged up by a local electric field caused by unbalance between ions and electrons in the wafer surface, resulting in dielectric breakdown thereof, i.e., charging damage. For example, during the plasma etching, ions are introduced in a direction perpendicular to the main surface of the wafer, whereas electrons can be introduced obliquely. Therefore, the charge balance is locally lost and, hence, the charge up may occur in any locations. The charging damage depends on a profile of an etching pattern as well as in-plane non-uniformity of a self-bias and thus may occur in any locations. Such drawbacks cannot be effectively solved by the techniques described in Patent Document 1.

In order to prevent the charging damage, it is effective to employ a method in which an amplitude of a radio frequency power for plasma generation is modulated to a pulse of ON/OFF or high level/low level with a variable duty.

However, in the method for pulse modulating the amplitude of the radio frequency power used for plasma processing, the amplitude of the radio frequency power changes at a regular interval with a pulse frequency, so that the impedance of the ion sheath or the plasma changes at a regular interval. Accordingly, an automatic matching function of the matching unit deteriorates, resulting in changes of the plasma generation and distribution characteristics or the ion energy in the chamber. As a result, it is difficult to reproduce the process. In addition, the radio frequency power supply is overheated or broken due to the reflection wave. For such reasons, it is difficult to apply the above method for mass production.

SUMMARY OF THE INVENTION

In view of the above, the present invention provides a practical plasma processing apparatus for ensuring stability and reproducibility of a process and a protection of a radio frequency power supply by minimizing an impedance change of an ion sheath or a plasma, or a reflection wave to the radio frequency power supply in a method for modulating an amplitude of a radio frequency power used for plasma processing at a regular interval, a plasma processing method and a computer readable storage medium.

In accordance with one aspect of the invention, there is provided a plasma processing apparatus including: a vacuum evacuable processing chamber; a first electrode for supporting a substrate to be processed in the processing chamber; a processing gas supply unit for supplying a processing gas into a processing space formed above the first electrode in the processing chamber; a plasma excitation unit for generating a plasma by exciting the processing gas in the processing chamber; a first radio frequency power supply unit for supplying a first radio frequency power to the first electrode to attract ions in the plasma to the substrate; a first radio frequency power amplitude modulation unit for modulating an amplitude of the first radio frequency power at a predetermined interval; and a first radio frequency power frequency modulation unit for modulating a frequency of the first radio frequency power in substantially synchronously with the amplitude modulation of the first radio frequency power.

In the above configuration, the first radio frequency power amplitude modulation unit modulates the amplitude of the first radio frequency for attracting ions in the plasma to the substrate at a predetermined interval, and temporally controls the energy of an ion entering the substrate. Meanwhile, the first radio frequency power frequency modulation unit modulates the frequency of the radio frequency power in substantially synchronously with the amplitude modulation of the first radio frequency power. Accordingly, the variation of the sheath capacitance by the power modulation can be suppressed. Further, the variation of the plasma impedance and further the reflection from the plasma can be suppressed, thereby achieving the stability and the reproducibility of the process.

It is preferred that the first radio frequency power amplitude modulation unit divides one cycle into a first, a second, a third and a fourth state, and controls the amplitude of the first radio frequency power to maintain at a first amplitude set value in the first state, change from the first amplitude set value to a second amplitude set value higher than the first amplitude set value in the second state, maintain the second amplitude set value in the third state, and change from the second amplitude set value to the first amplitude set value in the fourth state, and wherein the first radio frequency power frequency modulation unit controls the frequency of the first radio frequency power to maintain a first frequency set value in the first state, change from the first frequency set value to a second frequency set value higher than the first frequency set value in the second state, maintain the second frequency set value in the third state, and change from the second frequency set value to the first frequency set value in the fourth state.

With the synchronization relationship between the amplitude and frequency of the first radio frequency power, even though an amplitude modulation of the first radio frequency power is set arbitrarily to achieve desired process characteristic or capability, the variation or reflection of the plasma impedance due to the amplitude modulation can be effectively suppressed by the frequency modulation.

Further, the first radio frequency power supply unit may include: a first radio frequency power supply for generating the first radio frequency power; a matching unit having a matching circuit equipped with variable reactance elements electrically connected between an output terminal of the first radio frequency power supply and the first electrode; a sensor equipped with the matching circuit, for measuring a load impedance; and controller for varying the variable reactance elements so as to match the load impedance to a reference impedance in response to an output signal of the sensor; and a matching control unit for controlling the matching unit to perform impedance matching in either the first state or the third state.

Moreover, the plasma processing apparatus further may include a reflection wave measuring unit for measuring a power of a reflection wave transmitted on a transmission line from the first electrode to the first radio frequency power supply.

Preferably, the matching control unit feedbacks the output signal from the sensor to the controller only for a predetermined period set during the third state. Further, the first radio frequency power frequency modulation unit may select the first radio frequency set value so that the reflection wave power measured by the reflection wave measuring unit during the first state becomes minimum or a value close thereto.

It is preferred that the matching control unit feedbacks the output signal from the sensor to the controller only for a predetermined period set during the first state. Further, the first radio frequency power frequency modulation unit may select the third radio frequency set value so that the reflection wave power measured by the reflection wave measuring unit during the third state becomes minimum or a value close thereto.

Further, the first radio frequency power amplitude modulation unit may change the amplitude of the first radio frequency power from the first amplitude set value to the second amplitude set value in accordance with predetermined increasing characteristics, and the first radio frequency power frequency modulation unit changes the frequency of the first radio frequency power from the first frequency set value to the second frequency set value in accordance with predetermined increasing characteristics so that the reflection wave power measured by the reflection wave measuring unit during the second state becomes minimum or a value close thereto.

Furthermore, the first radio frequency power amplitude modulation unit may change the amplitude of the first radio frequency power from the second amplitude set value to the first amplitude set value in accordance with predetermined decreasing characteristics, and the first radio frequency power frequency modulation unit changes the frequency of the first radio frequency power from the second frequency set value to the first frequency set value in accordance with predetermined decreasing characteristics so that the reflection wave power measured by the reflection wave measuring unit during the fourth state becomes minimum or a value close thereto.

It is preferred that the first radio frequency power amplitude modulation unit corrects the first amplitude set value based on the reflection wave power (preferably, a moving average) measured by the reflection wave measuring unit during the first state so that a load power supplied to a load during a subsequent state of the first state becomes equal to a target value. Further, the first radio frequency power amplitude modulation unit may correct the second amplitude set value based on the reflection wave power (preferably, a moving average) measured by the reflection wave measuring unit during the third state so that a load power supplied to a load during a subsequent state of the third state becomes equal to a target value.

Preferably, a second electrode disposed to face the first electrode in parallel in the processing chamber; and a second radio frequency power supply unit for supplying to the second electrode a second radio frequency power suitable for generating a plasma of the processing gas.

Further, the plasma excitation unit may include: a second electrode disposed to face the first electrode in parallel in the processing chamber; and a second radio frequency power supply unit for supplying to the first electrode a second radio frequency power suitable for generating a plasma of the processing gas.

The plasma processing apparatus further may include a second radio frequency power frequency modulation unit for modulating the second radio frequency power in substantially synchronously with the amplitude modulation of the first radio frequency power.

The plasma processing apparatus further may include a second radio frequency power amplitude modulation unit for modulating a power of the second radio frequency power in substantially synchronously with the amplitude modulation of the first radio frequency power.

In accordance with another aspect of the invention, there is provided a vacuum evacuable processing chamber; a processing gas supply unit for supplying a processing gas into the processing chamber; a first radio frequency power supply unit for supplying a first radio frequency power to a first electrode or to an antenna provided inside or near the processing chamber to generate a plasma by exciting the processing gas in the processing chamber; a first radio frequency power amplitude modulation unit for modulating an amplitude of the first radio frequency power at a predetermined interval; and a first radio frequency power frequency modulation unit for modulating a frequency of the first radio frequency power in substantially synchronously with the amplitude modulation of the first radio frequency power.

In the above configuration, the first radio frequency power amplitude modulation unit modulates the amplitude of the first radio frequency power for attracting ions in the plasma to the substrate at a predetermined interval, and sequentially controls the plasma density in order to prevent, e.g., a charging damage. Meanwhile, the first radio frequency power frequency modulation unit modulates the frequency of the radio frequency power in substantially synchronously with the amplitude modulation of the first radio frequency power. Therefore, the variation of the sheath capacitance by the power modulation can be suppressed. Further, the variation of the plasma impedance and further the reflection from the plasma can be suppressed, thereby achieving the stability and the reproducibility of the process.

It is preferred that the first radio frequency power amplitude modulation unit divides one cycle into a first, a second, a third and a fourth state, and controls the amplitude of the first radio frequency power to maintain a first amplitude set value in the first state, change from the first amplitude set value to a second amplitude set value higher than the first amplitude set value in the second state, maintain the second amplitude set value in the third state, and change from the second amplitude set value to the first amplitude set value in the fourth state, and wherein the first radio frequency power frequency modulation unit controls the frequency of the first radio frequency power to maintain a first frequency set value in the first state, change from the first frequency set value to a second frequency set value lower than the first frequency set value in the second state, maintain the second frequency set value in the third state, and change from the second frequency set value to the first frequency set value in the fourth state.

With the synchronization relationship between the amplitude and frequency of the first radio frequency power, even though an amplitude modulation of the first radio frequency power is set arbitrarily to achieve desired process characteristic or capability, the variation or reflection of the plasma impedance due to the amplitude modulation can be effectively suppressed by the frequency modulation.

Preferably, the first radio frequency power supply unit includes: a first radio frequency power supply for generating the first radio frequency power; a matching unit having a matching circuit equipped with variable reactance elements electrically connected between an output terminal of the first radio frequency power supply and the first electrode; a sensor equipped with the matching circuit, for measuring a load impedance; and a controller for varying the variable reactance elements so as to match the load impedance to a reference impedance in response to an output signal from the sensor; and a matching control unit for controlling the matching unit to perform impedance matching in either the first state or the third state.

The matching control unit may feedback the output signal from the sensor to the controller only for a predetermined period set during the third state.

Further, the first radio frequency power frequency modulation unit may select the first radio frequency set value so that the reflection wave power measured by the reflection wave measuring unit during the first state becomes minimum or a value close thereto.

It is preferred that the matching control unit feedback the output signal from the sensor to the controller only for a predetermined period set during the first state. Further, the first radio frequency power frequency modulation unit may select the third radio frequency set value so that the reflection wave power measured by the reflection wave measuring unit during the third state becomes minimum or a value close thereto.

The first radio frequency power amplitude modulation unit may change the amplitude of the first radio frequency power from the first amplitude set value to the second amplitude set value in accordance with predetermined increasing characteristics, and the first radio frequency power frequency modulation unit changes the frequency of the first radio frequency power from the first frequency set value to the second frequency set value in accordance with predetermined decreasing characteristics so that the reflection wave power measured by the reflection wave measuring unit during the second state becomes minimum or a value close thereto.

It is preferred that the first radio frequency power amplitude modulation unit may change the amplitude of the first radio frequency power from the second amplitude set value to the first amplitude set value in accordance with predetermined decreasing characteristics, and the first radio frequency power frequency modulation unit changes the frequency of the first radio frequency power from the second frequency set value to the first frequency set value in accordance with predetermined increasing characteristics so that the reflection wave power measured by the reflection wave measuring unit during the fourth state becomes minimum or a value close thereto.

Further, the first radio frequency power amplitude modulation unit may correct the first amplitude set value based on the reflection wave power (preferably, a moving average) measured by the reflection wave measuring unit during the first state so that a load power supplied to a load during a subsequent state of the first state becomes equal to a target value. Furthermore, the first radio frequency power amplitude modulation unit may correct the second amplitude set value based on the reflection wave power (preferably, a moving average) measured by the reflection wave measuring unit during the third state so that a load power supplied to a load during a subsequent state of third state becomes equal to a target value.

It is preferred that the first electrode supports a substrate to be processed in the processing chamber.

The plasma processing apparatus further may include second electrode disposed to face the first electrode in parallel, the second electrode supporting a substrate to be processed in the processing chamber.

The plasma processing apparatus may further include a second radio frequency power supply unit for supplying a second radio frequency power to the first electrode to attract ions in the plasma to the substrate.

In accordance with still another aspect of the invention, there is provided a plasma processing method for modulating at a regular interval an amplitude of a radio frequency power supplied to an electrode or to an antenna installed inside or near a vacuum evacuable processing chamber, wherein a frequency of the radio frequency power is modulated in substantially synchronously with the amplitude modulation of the radio frequency power.

In the above-described plasma processing method, the power of the first radio frequency is modulated at a predetermined interval, and the plasma density or the ion energy is controlled sequentially. Meanwhile, the frequency of the radio frequency power is modulated in substantially synchronously with the amplitude modulation of the first radio frequency power. As a consequence, the variation of the sheath capacitance by the power modulation can be suppressed. Further, the variation of the plasma impedance and further the reflection from the plasma can be suppressed, thereby achieving the stability and the reproducibility of the process.

Preferably, the amplitude and the frequency of the radio frequency power are simultaneously varied in at least two steps during one cycle.

In accordance with still another aspect of the invention, there is provided a computer readable storage medium storing therein a computer executable control program, wherein the control program, when executed, controls a plasma processing apparatus to perform the plasma processing method described above.

BRIEF DESCRIPTION OF THE DRAWINGS

The other objects and features of the present invention will become apparent from the following description of embodiments, given in conjunction with the accompanying drawings, in which:

FIG. 17 demonstrates a block diagram of a configuration example of a control unit in accordance with the embodiment of the present invention.

DETAILED DESCRIPTION OF THE EMBODIMENT

The embodiments of the present invention will be described with reference to the accompanying drawings which form a part hereof.

Figure 1:
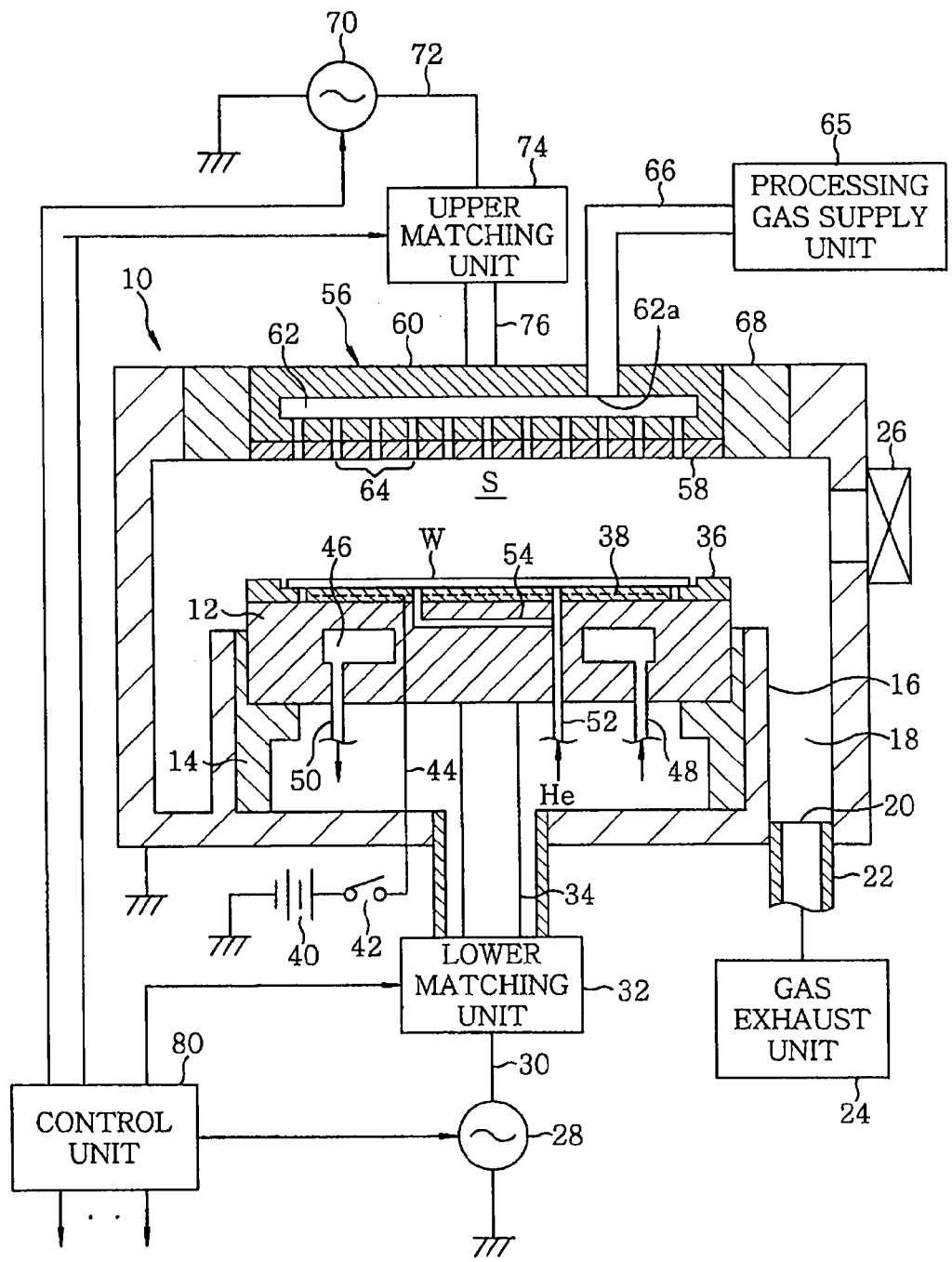
FIG. 1 is a cross sectional view showing a configuration of a capacitively coupled plasma etching apparatus in accordance with a first embodiment of the present invention.

FIG. 1 shows a configuration of a plasma processing apparatus in accordance with a first embodiment of the present invention. This plasma processing apparatus is configured as a capacitively coupled plasma etching apparatus of parallel plates type, and includes a cylindrical chamber (processing vessel) 10 made of metal, e.g., aluminum, stainless steel or the like. The chamber 10 is frame grounded.

A circular plate-shaped susceptor 12 for mounting thereon a substrate to be processed, e.g., a semiconductor wafer W, is horizontally provided in the chamber 10 and serves as a lower electrode. The susceptor 12 is made of, e.g., aluminum, and is supported, without being grounded, by an insulating cylindrical supporting portion 14 disposed on a bottom of the chamber 10 while extending vertically, the supporting portion 14 being made of, e.g., ceramic. A ring-shaped gas exhaust path 18 is formed along a periphery of the cylindrical supporting portion 14 between a sidewall of the chamber and a conductive cylindrical inner wall 16 vertically extended from the bottom of the chamber 10. A gas exhaust port 20 is provided at a bottom portion of the gas exhaust path 18.

Further, a gas exhaust unit 24 is connected to the gas exhaust port 20 via a gas exhaust line 22. The gas exhaust unit 24 has a vacuum pump such as a turbo-molecular pump or the like, so that a processing space inside the chamber 10 can be depressurized to a desired vacuum level. Attached to a sidewall of the chamber 10 is a gate valve 26 for opening and closing a loading/unloading port of the semiconductor wafer W.

A radio frequency power supply 28 is electrically connected to the susceptor 12 via an RF cable 30, a lower matching unit 32 and a lower power feed rod 34. The radio frequency power supply 28 outputs a bias control radio frequency power LF having a frequency (13.56 MHz or less in general) suitable for controlling energy of an ion attracted to the semiconductor wafer W on the susceptor 12. The radio frequency power supply 28 of the present embodiment is configured to pulse modulate the amplitude of the bias control radio frequency power LF (AM modulation) and pulse modulate the frequency thereof (FM modulation) under the control of the control unit 80. The RF cable 30 is formed as, e.g., a coaxial cable.

The lower matching unit 32 accommodates therein a matching circuit for performing impedance matching between the radio frequency power supply 28 side and an impedance of a load (mainly, electrode, plasma and chamber) side, and also has therein an RF sensor for automatic matching, a step motor, a controller and the like.

In a general plasma processing apparatus, a radio frequency power supply unit for supplying a radio frequency power to an antenna or an electrode provided inside or near the processing chamber has a radio frequency power supply for outputting a radio frequency power and a matching unit for matching an impedance of a load side (electrode, plasma and chamber) to an impedance of the radio frequency power supply. The radio frequency power supply is generally designed to have output resistance of about 50Ω.

Therefore, the impedance in the matching unit is set or controlled so that the impedance of the load side including that of the matching unit becomes about 50Ω. Such matching unit includes in the matching circuit one or more variable reactance elements (variable condenser, variable inductance coil and the like), and is configured to variably control the impedance in the matching unit and further the load impedance by selecting the position of each step within a variable range by the step motor and the like. If the plasma impedance changes due to a pressure change or the like during the plasma processing, the automatic matching function of the matching unit operates. By variably controlling the impedance position of the variable reactance element, the load impedance is automatically corrected to a matching point of about 50Ω.

The susceptor 12 has a diameter greater than that of the semiconductor wafer W. A semiconductor wafer W to be processed is mounted on a top surface of the susceptor 12, and a focus ring 36 is installed to surround the semiconductor wafer W. The focus ring 36 is made of any one material of, e.g., Si, SiC, C, $SiO_2$, depending on an etching target material of the semiconductor wafer W.

Installed on the top surface of the susceptor 12 is an electrostatic chuck 38 for adsorbing a wafer. The electrostatic chuck 38 has a structure in which a sheet-shaped or a mesh-shaped conductor is sealed in a film-shaped or a plate-shaped dielectric material, and is fixed to or formed as a unit with the top surface of the susceptor 12. A DC power supply 40 provided outside the chamber 10 is electrically connected to the corresponding conductor via a switch 42 and a high voltage line 44. The semiconductor wafer W can be adsorptively held on the electrostatic chuck 38 by Coulomb force generated by a DC voltage applied from the DC power supply 40.

The susceptor 12 has therein a ring-shaped coolant path 46 extending in, e.g., a circumferential direction. A coolant, e.g., cooling water, of a predetermined temperature flows from a chiller unit (not shown) via line 48, the coolant path 46, and line 50. By controlling a temperature of the coolant, it is possible to control a temperature of the semiconductor wafer W on the electrostatic chuck 38. Moreover, in order to increase the control accuracy of the wafer temperature, a heat transfer gas, e.g., He gas, is supplied from a heat transfer gas supply unit (not shown) to a gap between the electrostatic chuck 38 and the semiconductor wafer W via a gas supply line 52 and a gas channel 54 inside the susceptor 12.

An upper electrode 56 facing the susceptor 12 in parallel is provided at a ceiling portion of the chamber 10, the upper electrode 56 serving as a shower head. The upper electrode 56 includes an electrode plate 58 facing the susceptor 12; and an electrode supporting member 60 for supporting the electrode plate 58 in an attachable and detachable manner from the rear (top) surface thereof. The electrode supporting member 60 has therein a gas chamber 62, and a plurality of gas discharge openings 64 extending from the gas chamber 62 toward the susceptor 12 are formed in the electrode supporting member 60 and the electrode plate 58. A space S between the electrode plate 58 and the susceptor 12 serves as a plasma generation space or a processing space. A gas inlet port 62a provided at an upper portion of the gas chamber 62 is connected with a gas supply line 66 from a processing gas supply unit 65. The electrode plate 58 is made of, e.g., Si, SiC or C, and the electrode supporting member 60 is made of, e.g., alumite treated aluminum.

A gap between the upper electrode 56 and an opening on a top surface of the chamber 10 is airtightly sealed by a ring-shaped insulator 68 made of, e.g., alumina. The upper electrode 56 is attached to the chamber 10 without being electrically grounded. An additional radio frequency power supply 70 is electrically connected to the upper electrode 56 via an RF cable 72, an upper matching unit 74 and an upper power feed rod 76. The radio frequency power supply 70 outputs a radio frequency power HF with a frequency (preferably about 40 MHz or above) suitable for radio frequency discharge, i.e., plasma generation, without modulation, i.e., with a predetermined amplitude and frequency. The RF cable 72 is formed as, e.g., a coaxial cable. The matching unit 74 accommodates therein a matching circuit for performing impedance matching between the radio frequency power supply 70 side and a load (mainly, electrode and plasma) side, and also has therein an RF sensor for automatic matching, a step motor, a controller and the like. As will be described later, a control unit 80 having a microcomputer and various interface circuits independently controls an operation of each unit in the plasma etching apparatus and also controls an entire operation (sequence) of the apparatus. Here, the units in the plasma etching apparatus include the gas exhaust unit 24, the radio frequency power supplies 28 and 70, the matching units 32 and 74, the DC power supply switch 42, the chiller unit (not shown), the heat transfer gas supply unit (not shown), the processing gas supply unit 65 or the like.

In this plasma etching apparatus, in order to perform the etching, first of all, the semiconductor wafer W to be processed is loaded into the chamber 10 while opening the gate valve 26, and then is mounted on the electrostatic chuck 38. Further, an etching gas (generally, a gaseous mixture) is introduced into the chamber 10 at a predetermined flow rate from the processing gas supply unit 65, and a pressure inside the chamber 10 is set to a predetermined level by using the gas exhaust unit 24. Moreover, the plasma generation radio frequency power HF is supplied from the radio frequency power supply 70 to the upper electrode 56 via the upper matching unit 74.

Further, the bias control radio frequency power LF is supplied from the radio frequency power supply 28 to the susceptor 12 via the lower matching unit 32. In addition, a DC voltage is supplied from the DC power supply 40 to the electrostatic chuck 38 to fix the semiconductor wafer W on the electrostatic chuck 38. The etching gas discharged from the upper electrode 56 is converted into a plasma between both electrodes 12 and 56 by the radio frequency discharge, and a film to be processed on the surface of the semiconductor wafer W is etched in a desired pattern by radicals or ions generated from the plasma.

In this capacitively coupled plasma etching apparatus, by applying to the upper electrode 56 a radio frequency power HF of a comparatively higher frequency (greater than or equal to about 40 MHz) suitable for the plasma generation, it is possible to form a plasma of high density in a desired dissociation state and, hence, a high-density plasma can be obtained under the lower pressure condition. Further, a radio frequency LF of a comparatively lower frequency (smaller than or equal to about 13.56 MHz) suitable for the ion attraction is applied to the susceptor 12, so that it is possible to more accurately control the ion energy and increase the processing accuracy of the anisotropic etching. Further, by modulating the amplitude of the bias control radio frequency power LF to a pulse of ON/OFF or high level/low level with a variable duty under the control of the control unit 80, the energy of an ion entering the semiconductor wafer W is controlled sequentially. As a consequence, it is possible to further improve the processing characteristics such as selectivity and the like.

Figure 2:
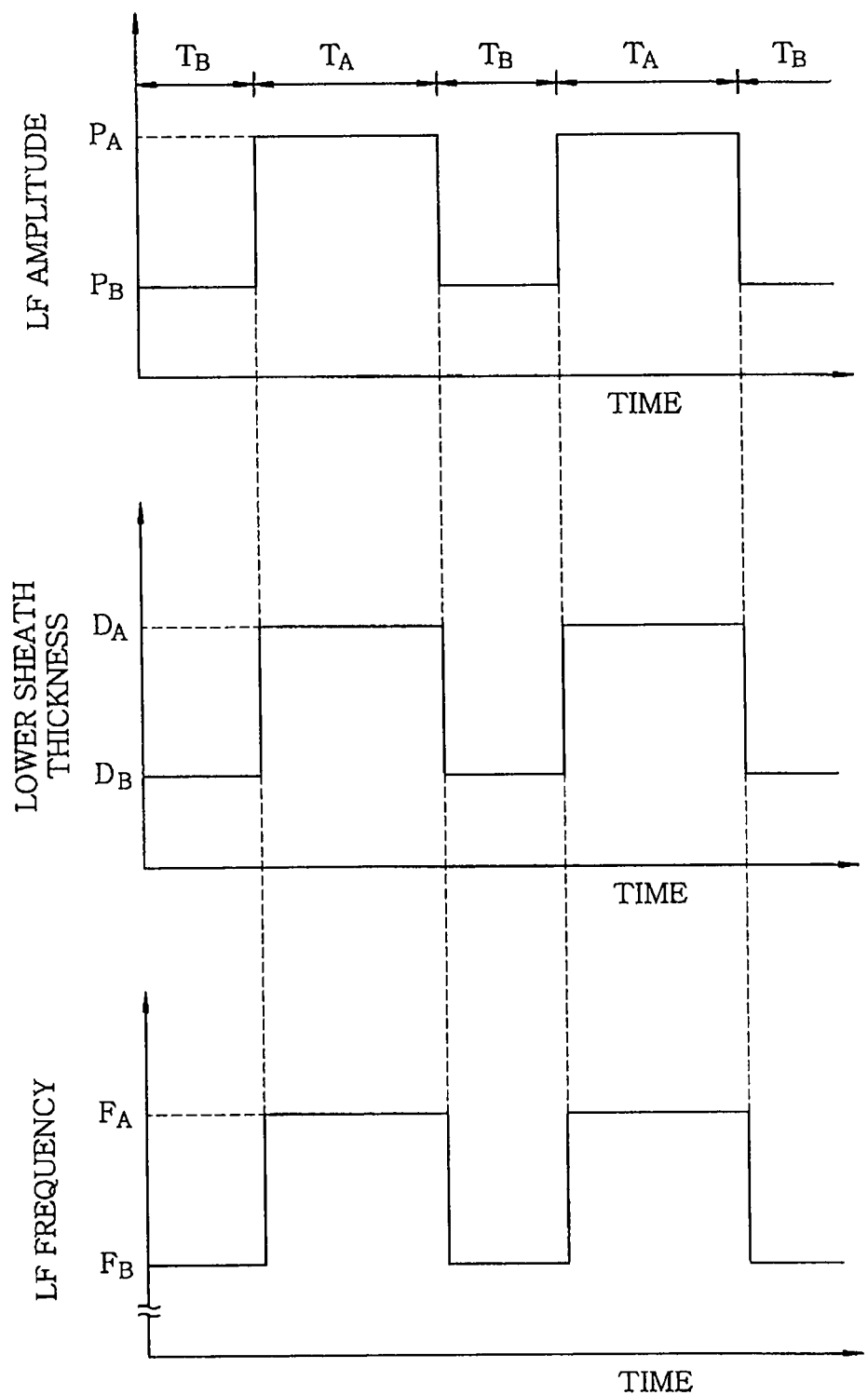
FIG. 2 provides a waveform diagram for explaining a basic technique of a pulse modulation method in accordance with the first embodiment.

FIG. 2 shows a basic technique of a pulse modulation method of the present embodiment. In the present embodiment, the amplitude of the bias control radio frequency power LF is pulse modulated at a predetermined frequency (e.g., 10 MHz) and duty (e.g., 50%) depending on a process to be performed, and the frequency thereof (LF frequency) is pulse modulated at the same time as the pulse modulation of the LF amplitude. Namely, during one cycle, there is a synchronization between the LF amplitude and the LF frequency, in which the LF frequency maintains a high level of set value $F_A$ (e.g., about 13.56 MHz) for a period $T_A$ at which the LF amplitude maintains a high level of set value $P_A$ (e.g., about 500 W), and the LF frequency maintains an low level of set value $F_B$ (e.g., about 12.05 MHz) for a period $T_B$ at which the LF amplitude maintains an low level of set value $P_B$ (e.g., about 100 W). Here, the high level and the low level of the LF frequency indicate relative high and low levels of two different frequency of set values, wherein the high level and the low level represent a set value of a comparatively higher frequency and a set value of a comparatively lower frequency, respectively.

Although FIG. 2 shows that the pulse modulations of the LF amplitude and the LF frequency are performed at the same timing (same phase and same duty), the timing (phase or duty) on a time axis of the pulse modulations may be different. Here, the frequency of the pulse modulations is required to be same or synchronized.

When the bias control radio frequency power LF is supplied to the susceptor 12, the LF amplitude is generally proportional to a thickness of an ion sheath (lower sheath thickness) formed above the susceptor 12. Further, when the LF amplitude has a predetermined high level of value $P_A$, the lower sheath thickness has a predetermined high level of value $D_A$. When the LF power has a predetermined low level of value $P_B$, the lower sheath thickness has a predetermined low level of value $D_B$. Here, as the lower sheath thickness increases, the sheath capacitance thereof decreases. As the lower sheath thickness decreases, the sheath capacitance thereof increases.

In the present embodiment, under the control of the control unit 80, the lower matching unit 32 is configured to match the impedance of the load side to the impedance of the radio frequency power supply 28 during the high level period $T_A$ and ignore, i.e., does not detect, the load impedance during the low level period $T_B$. With this configuration, the impedances are matched during the high level period $T_A$ in which the lower sheath thickness is the high level of value $D_A$. However, during the low level period $T_B$, the impedances are mismatched from the resonance point by an amount corresponding to the lower sheath thickness difference between the high level of value $D_A$ and the low level value of $D_B$, i.e., corresponding to the increase of the lower sheath capacitance. In order to suppress the impedance mismatching during the low level period $T_B$ by minimizing the decrease of the lower sheath thickness, i.e., the increase of the sheath capacitance, the LF frequency may be preferably decreased to a low level of value $F_B$ lower than a high level of the reference frequency $F_A$.

In this pulse modulation method of the present embodiment, the impedance matching is performed between the radio frequency power supply 28 and the load by the automatic matching function of the lower matching unit 32 during the high level of period $T_A$. During the low level of period $T_B$, the lower matching unit 32 does not respond to the load impedance and, instead, the LF frequency is decreased by the radio frequency power supply 28 to correct the impedance mismatching. Therefore, even if the capacitance of the lower sheath changes at a regular interval due to the regular change of the LF power changes between the high level and the low level, the plasma impedance or the load impedance does not abruptly change. Therefore, a hunting phenomenon during the automatic matching of the lower matching unit 32 does not occur, and the reflection from the plasma load to the radio frequency power supply 28 can be effectively suppressed.

Figure 3:
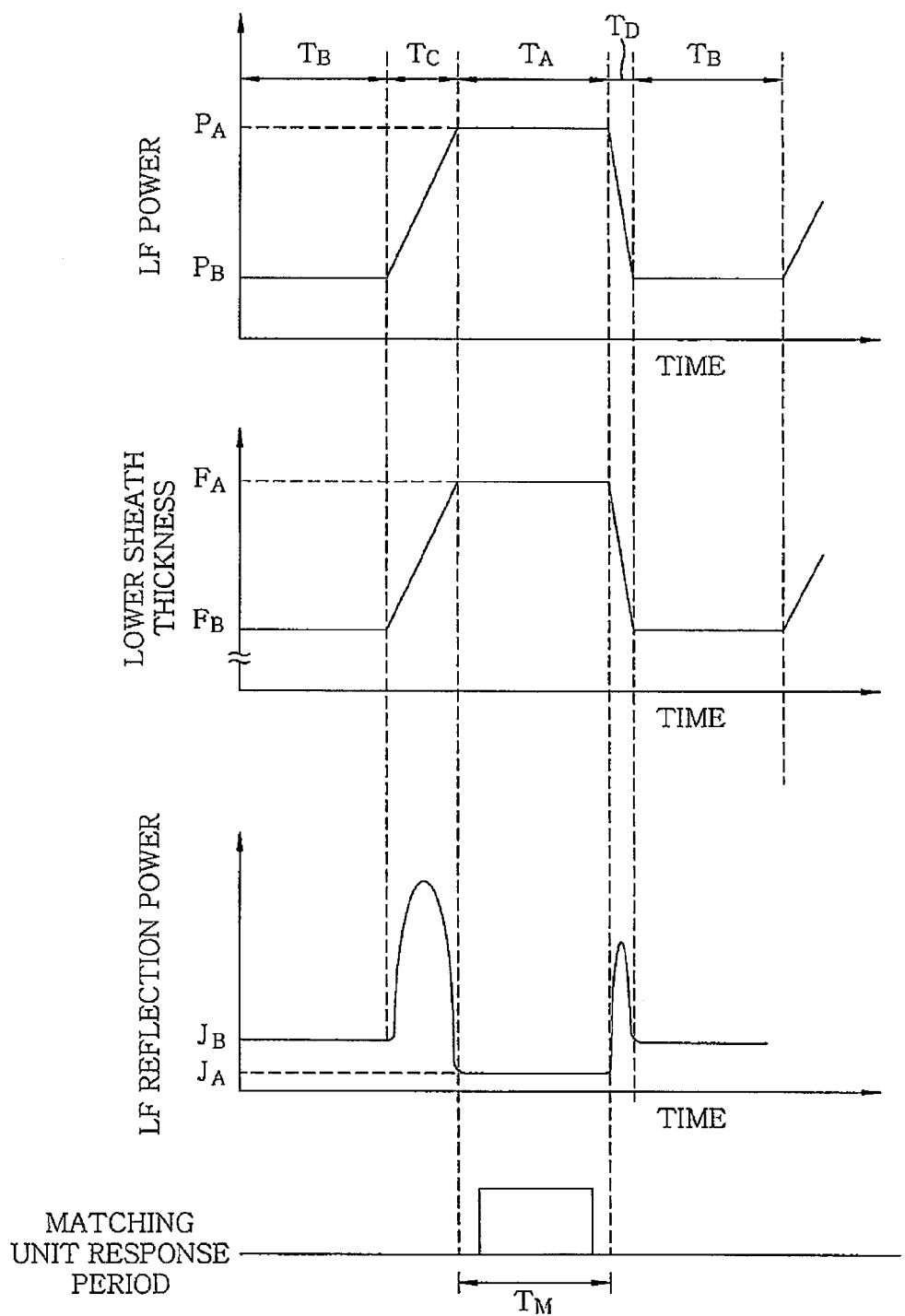
FIG. 3 presents a waveform diagram illustrating a synchronization relationship between an LF power and an LF frequency in the pulse modulation method in accordance with the first embodiment.

FIG. 3 provides detailed description of the synchronization between the LF amplitude and the LF frequency in the pulse modulation of the present embodiment. As illustrated, one cycle of the pulse modulation is divided into four states, i.e., a first state $T_B$, a second state $T_C$, a third state $T_A$ and a fourth state $T_D$. Here, the first state $T_B$ corresponds to the low level period, and the third state $T_A$ corresponds to the high level period. The second state $T_C$ is a period during which the LF amplitude and the LF frequency change from the low level of set values $P_B$ and $F_B$ to the high level of set values $P_A$ and $F_A$, respectively. The fourth state $T_D$ is a period during which the LF amplitude and the LF frequency change from the high level of set values $P_A$ and $F_A$ to the low level of set values $P_B$ and $F_B$, respectively.

During the third state $T_A$, the impedance matching is performed by the automatic matching function of the lower matching unit 32, as described above. For that reason, the power of the LF reflection wave from the load plasma to the radio frequency power supply 28 is at a very low level $J_A$. Even during the first state $T_B$, the impedance mismatching is corrected by the pulse modulation of the LF frequency, as described above. As a consequence, the LF reflection power is maintained at a very low level $J_B$. However, during the second state $T_C$ and the fourth state $T_D$, the automatic matching function of the compensating function does not practically operate, so that an impulse-shaped LF reflection wave is generated.

If the lower matching unit 32 reacts to the change of the LF reflection power during the second state $T_C$ and the fourth state $T_D$, the stability and the accuracy of the automatic matching decrease. Accordingly, the LF reflection power increases during the third state $T_A$ and, further, the LF reflection power increases during the first state $T_B$.

In the present embodiment, the control unit 80 controls timing characteristics (frequency, duty, phase and the like) of the pulse modulation via the radio frequency power supply 28, and manages the timing of the first to the fourth state sequentially or repetitively. Further, the control unit 80 controls a cycle or a period during which the lower matching unit 32 responds to the load impedance. As illustrated in FIG. 3, a matching unit response period $T_M$ is set during the third state $T_A$ without interfering the end of the second state $T_C$ and the start of the fourth state $T_D$.

Figure 4:
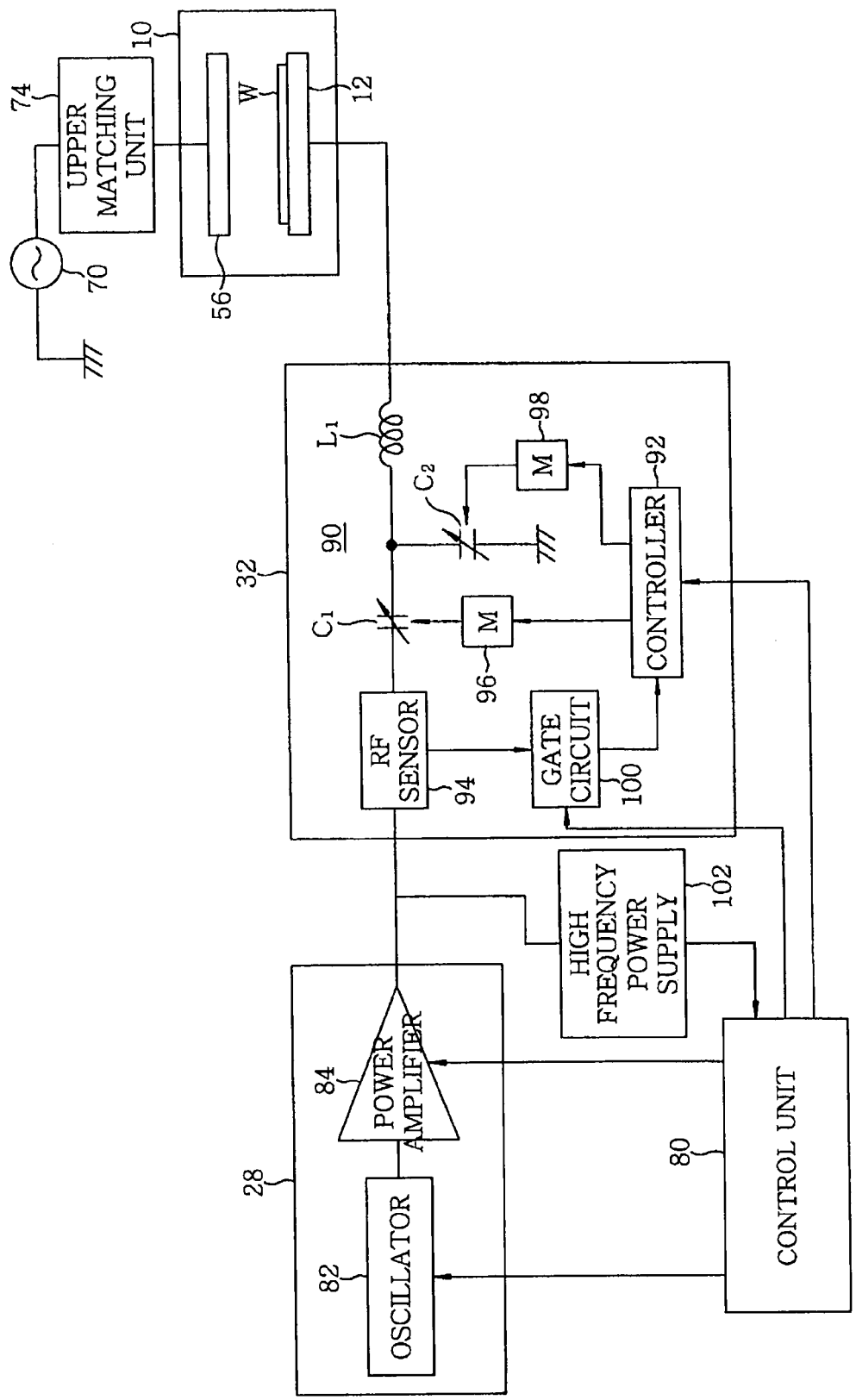
FIG. 4 shows configurations of a matching unit and a radio frequency power supply for bias control in accordance with the first embodiment.

FIG. 4 shows configurations of the radio frequency power supply 28 and the lower matching unit 32 in the present embodiment. The radio frequency power supply 28 includes an oscillator 82 for outputting a sine wave of a variable frequency and a power amplifier 84 for amplifying an amplitude of the sine wave from the oscillator 82 at a variable amplification rate.

The control unit 80 performs a variable control or a pulse modulation of the LF frequency via the oscillator 82, and also performs a variable control or a pulse modulation of the LF amplitude via the power amplifier 84.

The lower matching unit 32 includes a matching circuit 90 having one or more variable reactance elements, a controller 92 for variably controlling an impedance of each of the variable reactance elements independently, and an RF sensor 94 measuring a load impedance including that of a matching circuit 90.

In the illustrated example, the matching circuit 90 is configured as a T-shaped circuit having two variable capacitors $C_1$ and $C_2$ and a single inductance coil $L_1$, and the controller 92 variably controls impedance positions of the variable condensors $C_1$ and $C_2$ via step motors 96 and 98, respectively. The RF sensor 94 is provided with, e.g., a voltage sensor and a current sensor which detect an RF voltage and an RF current on a transmission line in their respective installation positions. The measured load impedance obtained from the measured voltage and current requires to be represented as a complex number. The controller 92, e.g., a microcomputer, receives the measured load impedance from the RF sensor 94 via a gate circuit 100, and also receives various set values or commands form the control unit 80.

The gate circuit 100 transmits an output signal, i.e., the measured value of the impedance, of the RF sensor 94 to the controller 92 under the control of the control unit 80 only for the matching unit response period $T_M$ (FIG. 3) set during the third state $T_A$ in each cycle of pulse modulation. Accordingly, the controller 92 receives the input signal from the RF sensor 94 only for the matching unit response period $T_M$ during the third state $T_A$, and variably controls the impedance positions of the variable condensers $C_1$ and $C_2$ via the step motors 96 and 98 so that the measured load impedance becomes equal to the reference impedance or a matching point (about 50Ω in general).

This embodiment is also provided with a reflection wave measuring circuit 102 installed at an output terminal of the radio frequency power supply 28 for receiving a reflection wave transmitted on a transmission line from a load side and measuring a power of the reflection wave. As will be described later, the control unit 80 selects or controls various parameters in each state of the pulse modulation based on the reflection wave power measured by the reflection wave measuring circuit 102.

As set forth above, in the pulse modulation of the LF frequency in the present embodiment, the LF frequency is decreased during the first state $T_B$ to an low level of value $F_B$ lower than a reference frequency $F_A$ of a high level in the third state $T_A$.

Figure 5:
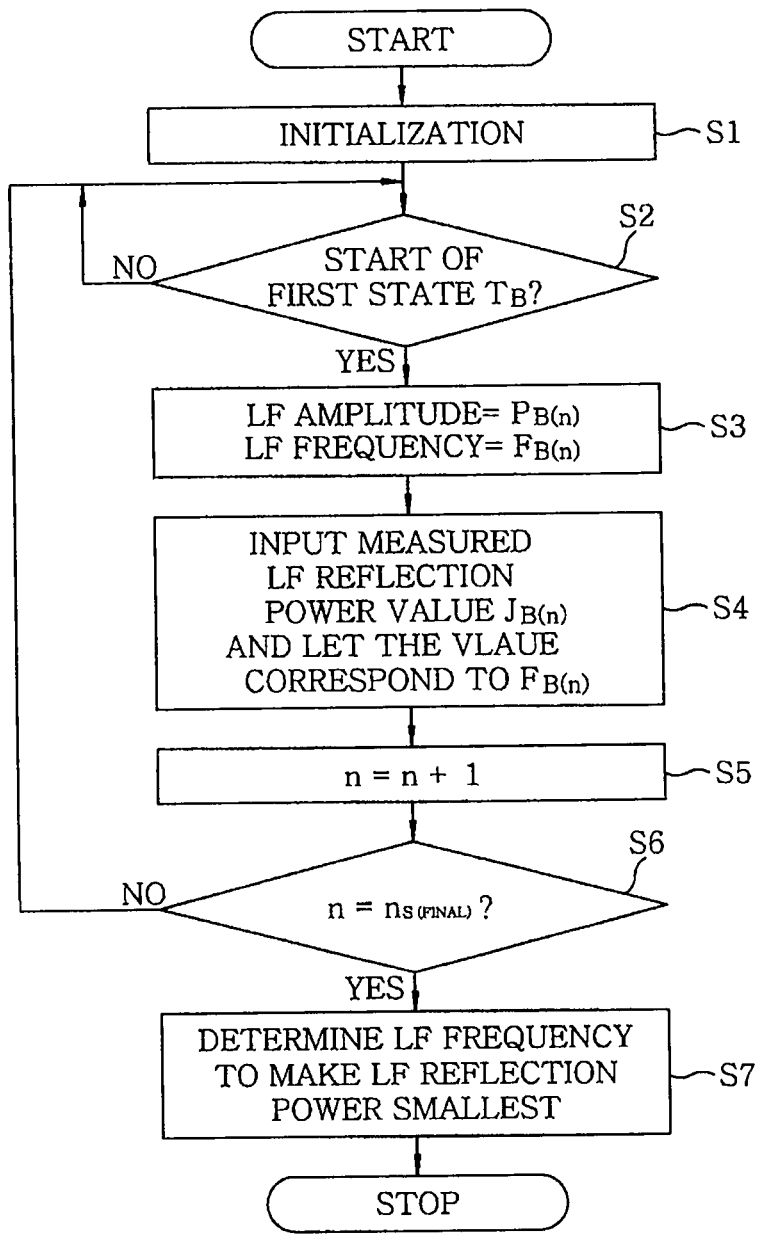
FIG. 5 offers a flowchart depicting a sequence of a program for determining a frequency set value of a low level in accordance with the first embodiment.

FIG. 5 shows a sequence of a program executed by the control unit 80 to determine a low level frequency of set value $F_B$. This flow should be performed after the system operates and the automatic matching operation by the control unit 80 and the lower matching unit 32 is stabilized.

First of all, a parameter and a set value required for initialization are input (step $S_1$). Next, when the fourth state $T_D$ as a previous cycle is shifted to the first state $T_B$ as a current cycle (step $S_2$), the LF amplitude is controlled to the low level of set value $P_B$ via the power amplifier 84, and the LF frequency is controlled to an low level of provisional frequency set value $F_{B(1)}$ via the oscillator 82 (step $S_3$). Then, the reflection wave measuring circuit 102 detects an LF reflection power for an LF amplitude measuring period set during the first state $T_B$, thereby obtaining a measured value thereof (RMS value or average value) $J_{B(1)}$. The control unit 80 makes the measured LF reflection power $J_{B(1)}$ correspond to the provisional frequency set value $F_{B(1)}$ on a memory (step $S_4$).

Figure 6:
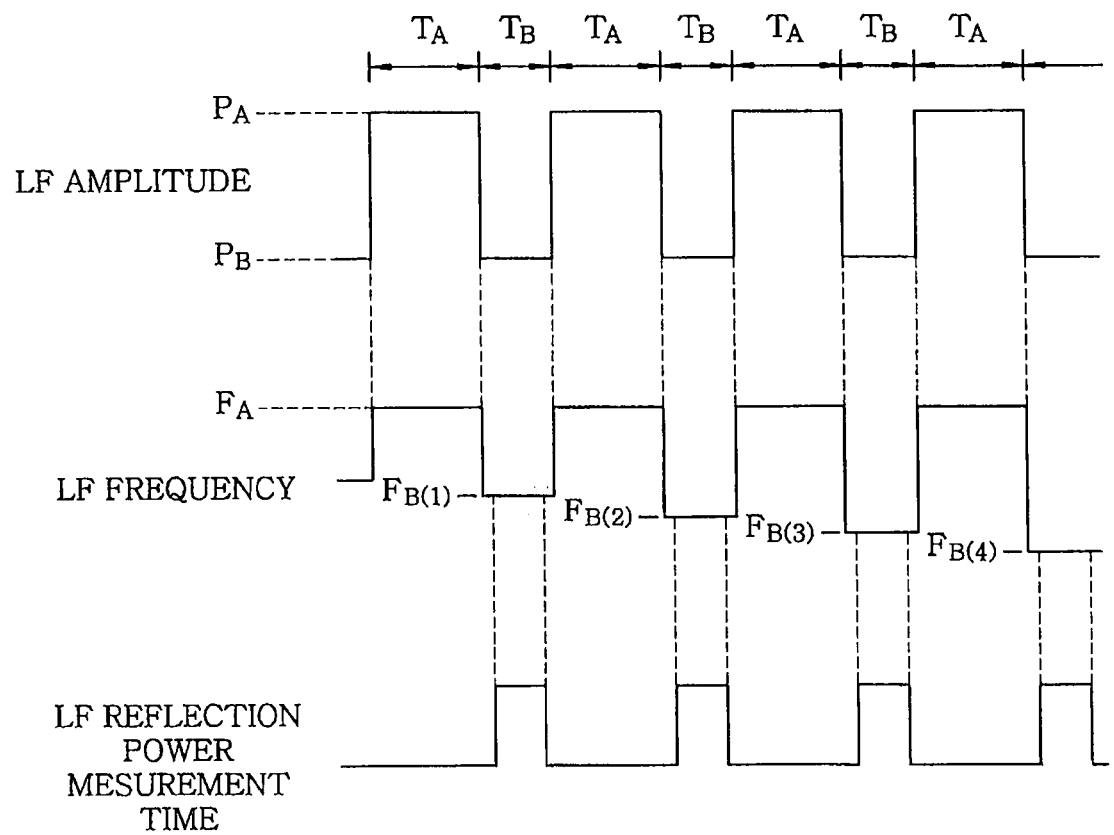
FIG. 6 represents a waveform diagram low level for explaining a technique used in the sequence shown in FIG. 5.
Figure 7:
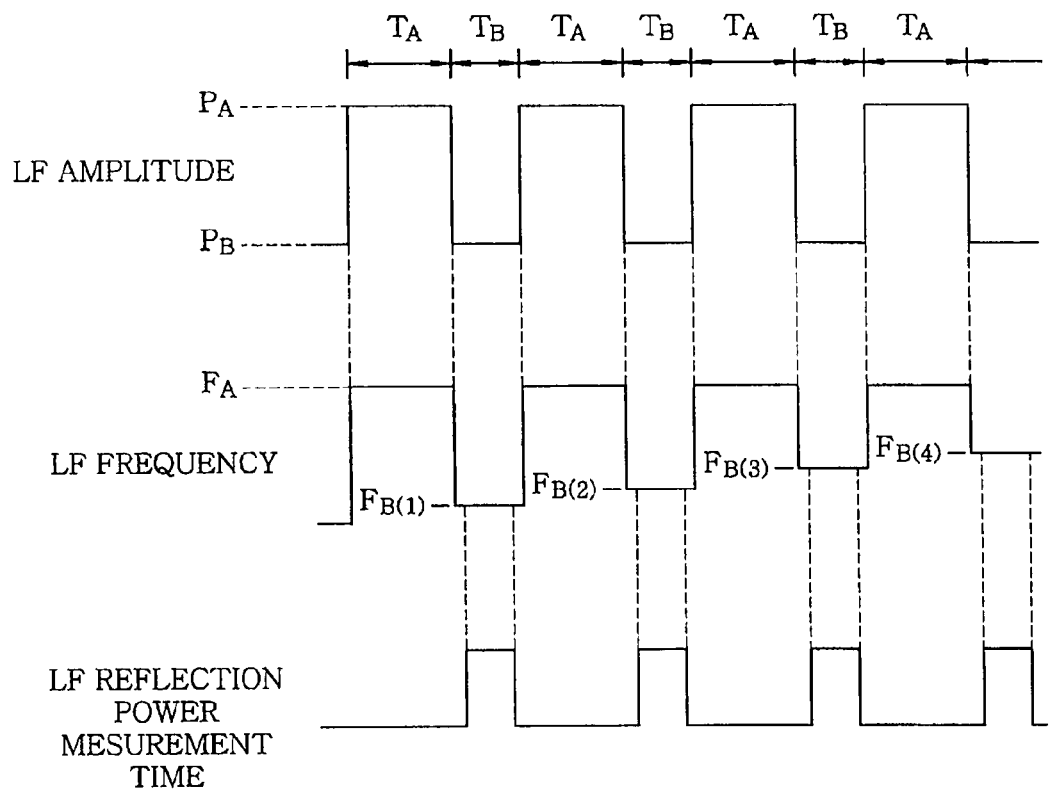
FIG. 7 sets forth a waveform diagram for explaining a technique used in the sequence shown in FIG. 5.

In each cycle, the provisional frequency set value $F_{B(n)}$ of the first state $T_B$ is decreased by a predetermined step width as shown in FIG. 6, or is increased by a predetermined step width as shown in FIG. 7. Further, the measured LF reflection power $J_{B(n)}$ is recorded to correspond to the provisional frequency set value $F_{B(n)}$, and this series of processes is repeated predetermined times (steps $S_2$ to $S_6$). In FIGS. 6 and 7, the second state $T_C$ and the fourth state $T_D$ are omitted.

Figure 8:
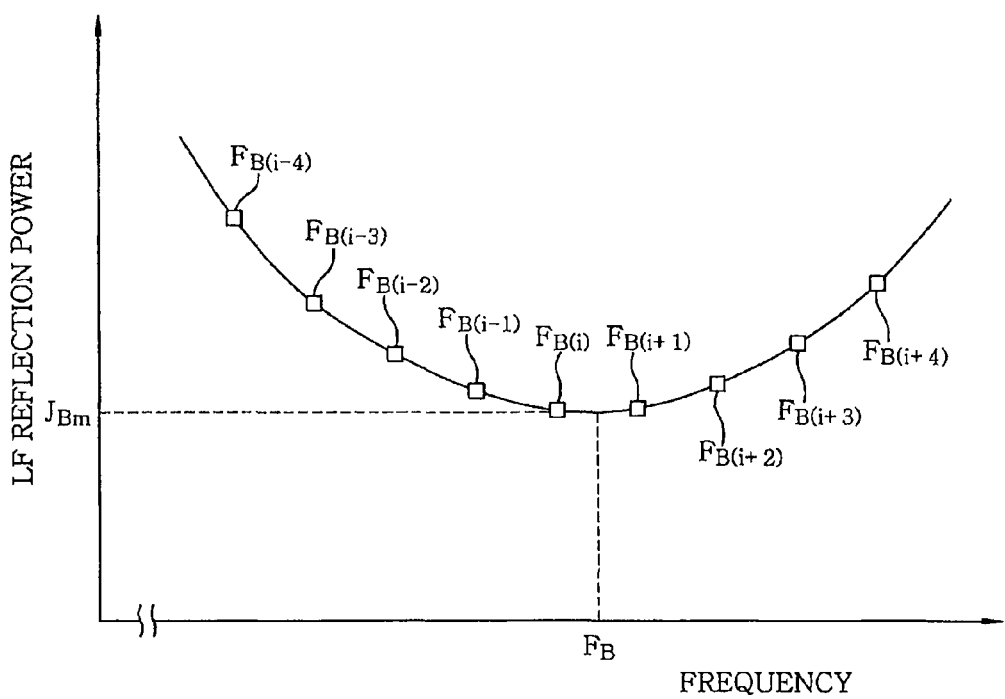
FIG. 8 explains a technique for displaying measured data as a graph in the sequence shown in FIG. 5.

Moreover, the measured data is displayed as a graph as illustrated in FIG. 8, and an LF frequency corresponding to a minimum LF reflection power $J_{Bm}$ obtained by, e.g., a least mean square method is calculated. The LF frequency thus calculated is defined as a low level of frequency set value $F_B$ of the first state $T_B$ (step $S_7$).

Figure 9:
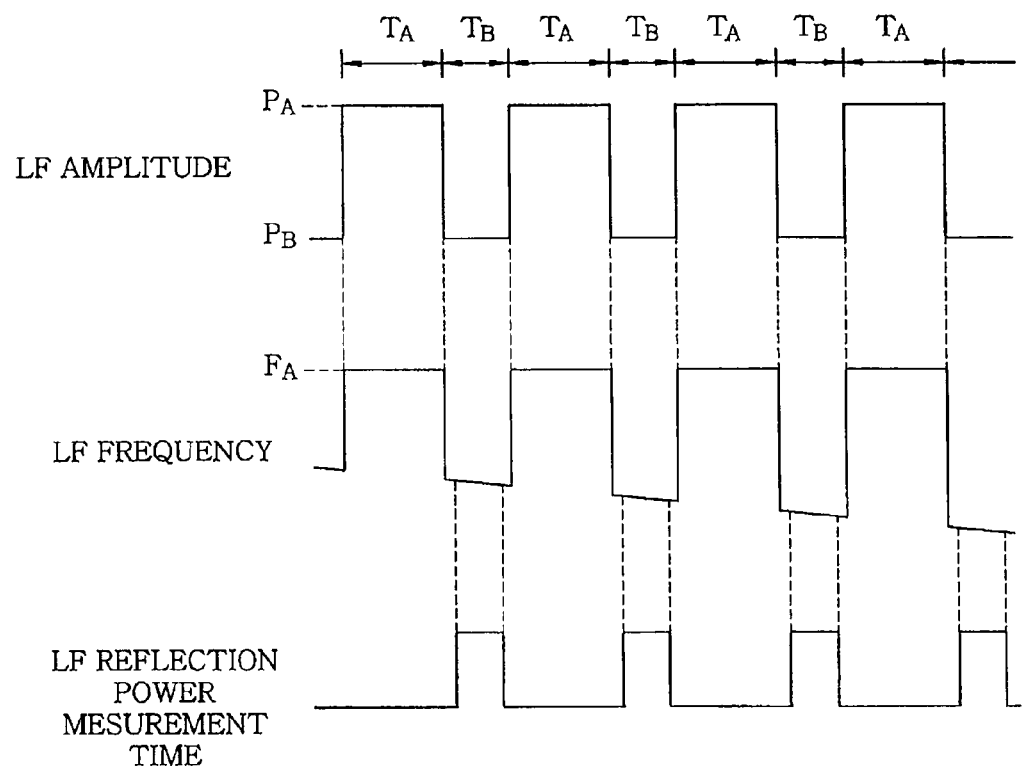
FIG. 9 is a waveform diagram for explaining a technique of a modification used in the sequence shown in FIG. 5.

Besides, instead of stepwisely decreasing or increasing the provisional frequency set value of the first state $T_B$ by a predetermined frequency different at every cycle, the LF frequency can be swept such that the LF frequency is varied continuously during the first states $T_B$'s at a predetermined increasing or decreasing rate over several cycles, as depicted in FIG. 9.

Further, instead of using the above-described sequence (FIG. 5), an low level of frequency set value $F_B$ of the first state $T_B$ can be selected or determined by a predetermined equation having as a variable a lower sheath thickness estimated based on previously obtained data and process conditions (e.g., an HF/LF amplitude, a pressure, gas species and the like). In that case, the frequency set value $F_B$ requires to be examined or reselected based on the LF reflection power measured by the reflection wave measuring circuit 102.

Figure 10:
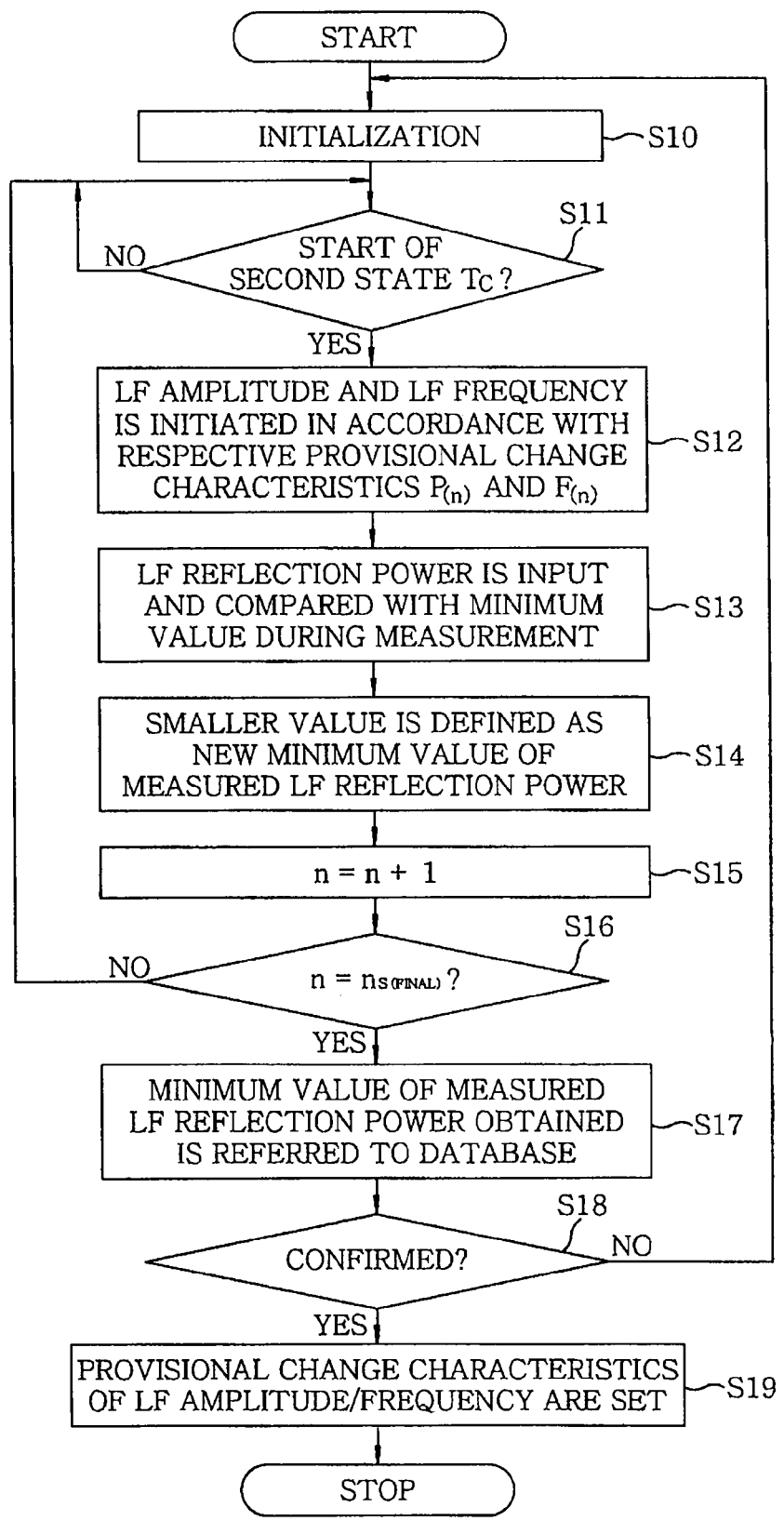
FIG. 10 depicts a flowchart showing a sequence of a program for determining characteristics on increase in an LF amplitude/frequency.
Figure 11:
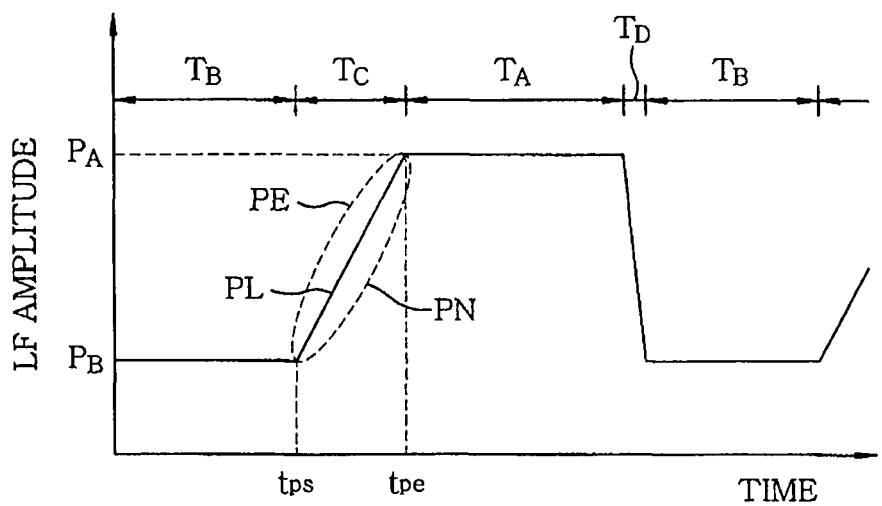
FIG. 11 provides a waveform diagram illustrating an operation of the sequence shown in FIG. 10.
Figure 11:
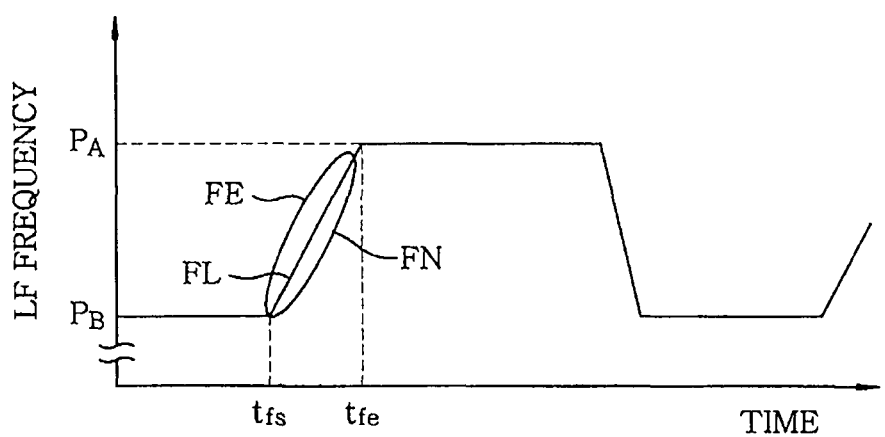
Figure 11:
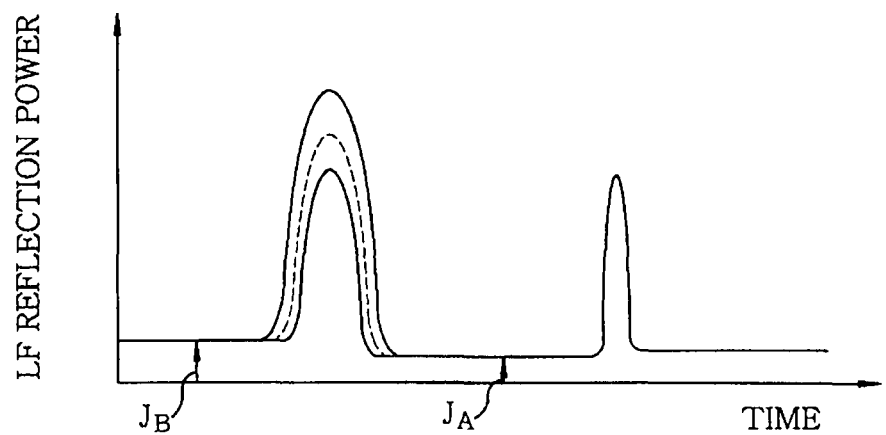

FIG. 10 presents a sequence of a program executed by the control unit 80 to determine characteristics (increase characteristics) for changing the LF amplitude and the LF frequency from the low level to the high level in the second state $T_C$. FIG. 11 shows an operation of this sequence. This sequence should be performed after set values of various parameters related to the third state $T_A$ and the first state $T_B$ are determined and the low LF reflection power during both states $T_B$ and $T_A$ are stabilized at low values of the levels $J_B$ and $J_A$.

First of all, a parameter and a set value required for initialization are input (step $S_{10}$). Next, when the first state $T_B$ is shifted to the second state $T_C$ (step $S_{11}$), the change of the LF amplitude and the LF frequency is initiated in accordance with respective provisional change characteristics $P_{(n)}$ and $F_{(n)}$ via the power amplifier 84 and the oscillator 82 (step $S_{12}$). Here, as can be seen from FIG. 11, the provisional change characteristics $P_{(n)}$ and $F_{(n)}$ are independently set while using start time $t_{ps}$ and $t_{fs}$ and end time $t_{pe}$ and $t_{fe}$ of the change (initiation), a change function, and the like as parameters. The change function is not limited to an inclined straight line PL or FL, and may be, e.g., a logarithmic curve PE or FE, or a curve PN and FN of an N-th order function (N≥2) or an exponential function.

Thereafter, the LF reflection power is measured by the reflection wave measuring circuit 102 during the second state $T_C$, and the control unit 80 compares the measured value with a minimum value of the LF reflection power at that time (step $S_{13}$). Next, a smaller value is defined as a new minimum value of the measured LF reflection power (step $S_{14}$). Since a minimum value does not exist at the beginning, a first measured value is defined as a minimum value. The measured LF reflection power requires to be obtained as a peak value of an impulse waveform, an average value or an integral value.

In each cycle, the provisional change characteristics $P_{(n)}$ and $F_{(n)}$ of the LF amplitude and the LF frequency are properly or sequentially changed, and a series of processes such as the LF reflection power measurement, the comparison, the minimum value renewal and the like in the second state $T_C$ is repeated predetermined times (steps $S_{11}$ to $S_{16}$). Thereafter, a minimum value of the measured LF reflection power obtained after a final renewal is referred to database, thereby checking whether or not it is a proper value or a value within a tolerable range (steps $S_{17}$ and $S_{18}$). If it is a proper value, the provisional change characteristics $P_{(n)}$ and $F_{(n)}$, when the measured LF reflection power is the minimum value, are set as normal change characteristics (step $S_{19}$). If the minimum value of the measured LF reflection power is not a proper value after referring to the database (step $S_{17}$), various parameters or set values are changed during initialization and, then, the aforementioned sequence is started again from the beginning (steps $S_{10}$ to $S_{17}$).

Although detailed description will be omitted, the characteristics (decrease characteristics) for changing the LF amplitude and the LF frequency from the high level to the low level in the fourth state $T_D$ can be determined in the sequence described in the above sequence (FIG. 10).

Hereinafter, an LF amplitude control method for improving stability and reproducibility of an etching process in the pulse modulation of the present embodiment will be described.

As set forth above, in the present embodiment, the LF reflection power from the plasma load to the radio frequency power supply 28 is minimized by the pulse modulation of the LF frequency in the first state $T_B$ of the low level and by the automatic matching of the lower matching unit 32 in the third state $T_A$ of the high level. However, the LF reflection power cannot be completely removed. Therefore, if a power supplied to the load, i.e., a load power, is smaller than a set value or a target value, the ion energy decreases undesirably. Further, when the load power changes by the change of the LF reflection power, the ion energy changes, thereby deteriorating the stability and the reproducibility of the process.

Figure 12:
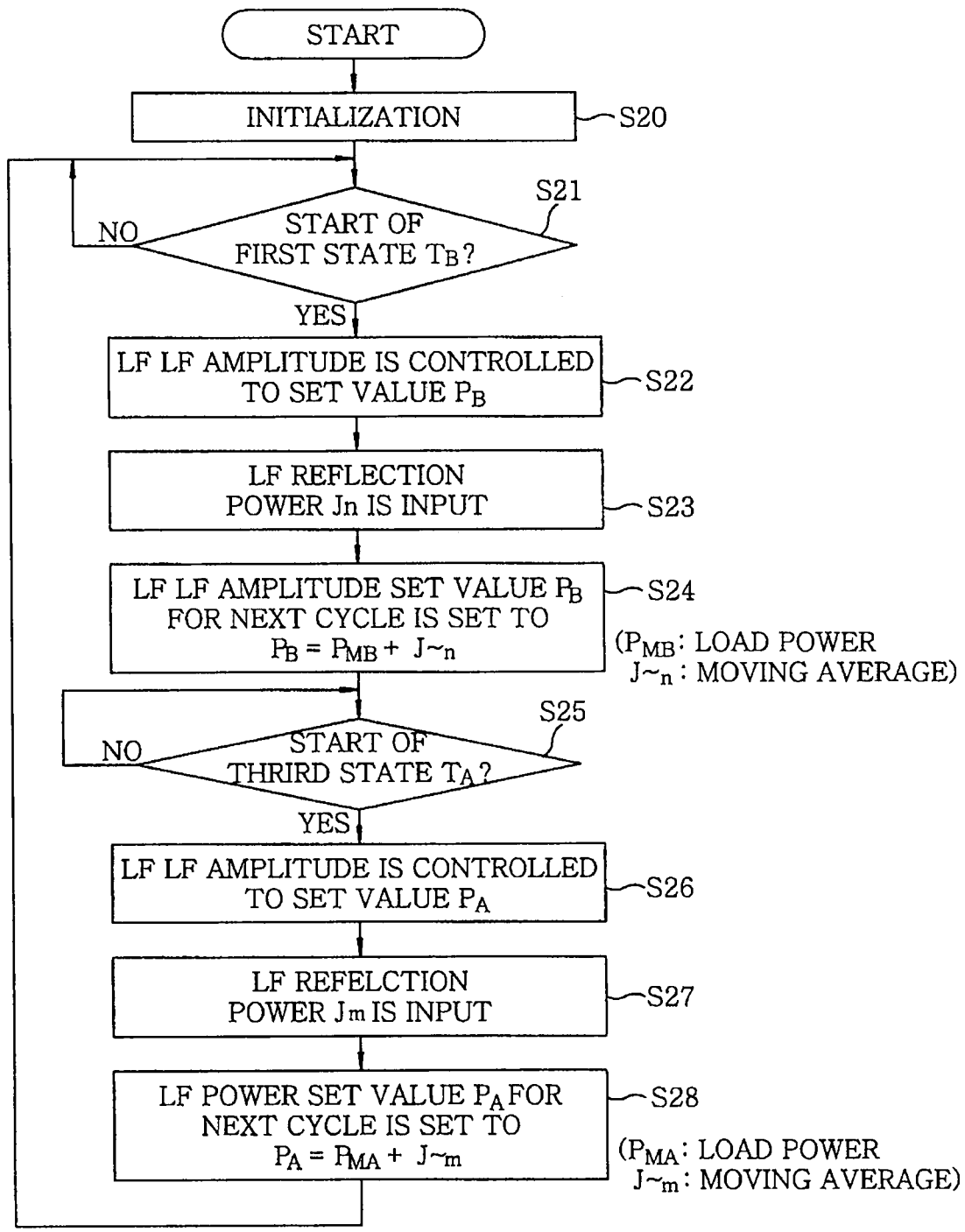
FIG. 12 offers a flowchart showing a sequence of a program for controlling an LF amplitude.
Figure 13:
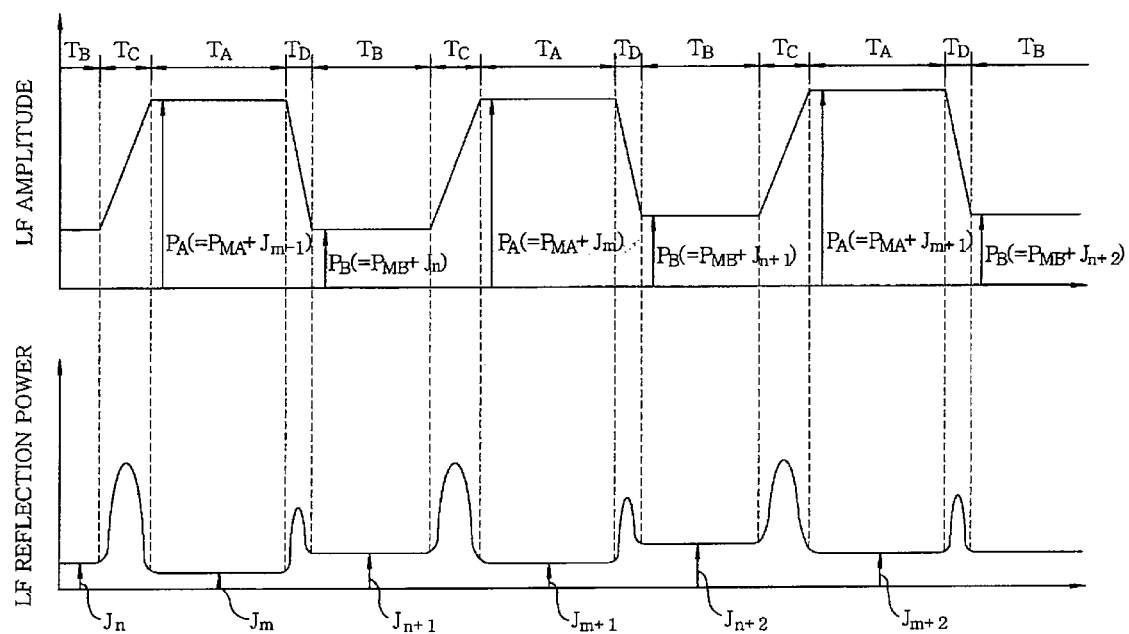
FIG. 13 presents a waveform diagram illustrating an operation of the flowchart shown in FIG. 12.

The plasma etching apparatus of the present embodiment has a function of compensating the existence or the variation of the LF reflection power. FIG. 12 shows a sequence of a program executed by the control unit 80 to control the LF amplitude of the present embodiment. FIG. 13 depicts an example of an operation of the LF amplitude control method. First of all, a parameter and a set value required for initialization are input (step $S_{20}$). Next, when the fourth state $T_D$ as a previous cycle is shifted to the first state $T_B$ as a current cycle (step $S_{21}$), the LF amplitude is controlled to the set value $P_B$ for the current cycle via the power amplifier 84 (step $S_{22}$). Thereafter, an LF reflection power is detected by the reflection wave measuring circuit 102 for an LF amplitude measuring period set during the first state $T_B$, thereby obtaining a measured value (RMS or average value) $J_n$. The control unit 80 inputs the measured LF reflection power $J_n$ (step $S_{23}$).

Next, the control unit 80 calculates the LF amplitude set value $P_B$ for a next cycle in the first state $T_B$ by using a following Eq. (1) (step $S_{24}$).

$$P_B = P_{MB} + J_{-n} \qquad \text{Eq. (1)}$$

Here, $P_{MB}$ indicates a target value of the load power to be supplied to the load during the first state $T_B$, and $J_{-n}$ represents a moving average of the measured LF reflection power $J_n$ in the current cycle.

Next, when the second state $T_C$ is shifted to the third state $T_A$ in the current cycle (step $S_{25}$), the LF amplitude is controlled to the set value $P_A$ for the current cycle via the power amplifier 84 (step $S_{26}$). Thereafter, an LF reflection power is detected by the reflection wave measuring circuit 102 for an LF amplitude measuring period set during the third state $T_A$, thereby obtaining a measured value (RMS value or average value) $J_m$. The control unit 80 inputs the measured LF reflection power $J_m$ (step $S_{27}$).

Then, the control unit 80 calculates the LF amplitude set value $P_A$ for a next cycle in the third state $T_A$ by using a following Eq. (2) (step $S_{28}$).

$$P_A = P_{MA} + J_{-m} \qquad \text{Eq. (1)}$$

Here, $P_{MA}$ indicates a target value of the load power to be supplied to the load during the third state $T_A$, and $J_{-m}$ represents a moving average of the measured LF reflection power $J_m$ in the current cycle.

By repeating the series of processes (steps $S_{21}$ to $S_{28}$) for each cycle of the pulse modulation, the LF amplitude in which the LF reflection power and the variation (moving average) thereof are added to the load power to be supplied to the plasma load in the first state $T_B$ and the third state $T_A$ is output from the radio frequency power supply 28, as illustrated in FIG. 13. Accordingly, the LF reflection power and the variation thereof are canceled out, and the load power of a set value (target value) is stably supplied to the plasma load, which results in improvement of the stability and the reproducibility of the process. Further, the function of compensating the LF reflection power and the variation thereof may operate in either the first state $T_B$ or the third state $T_A$.

Figure 14:
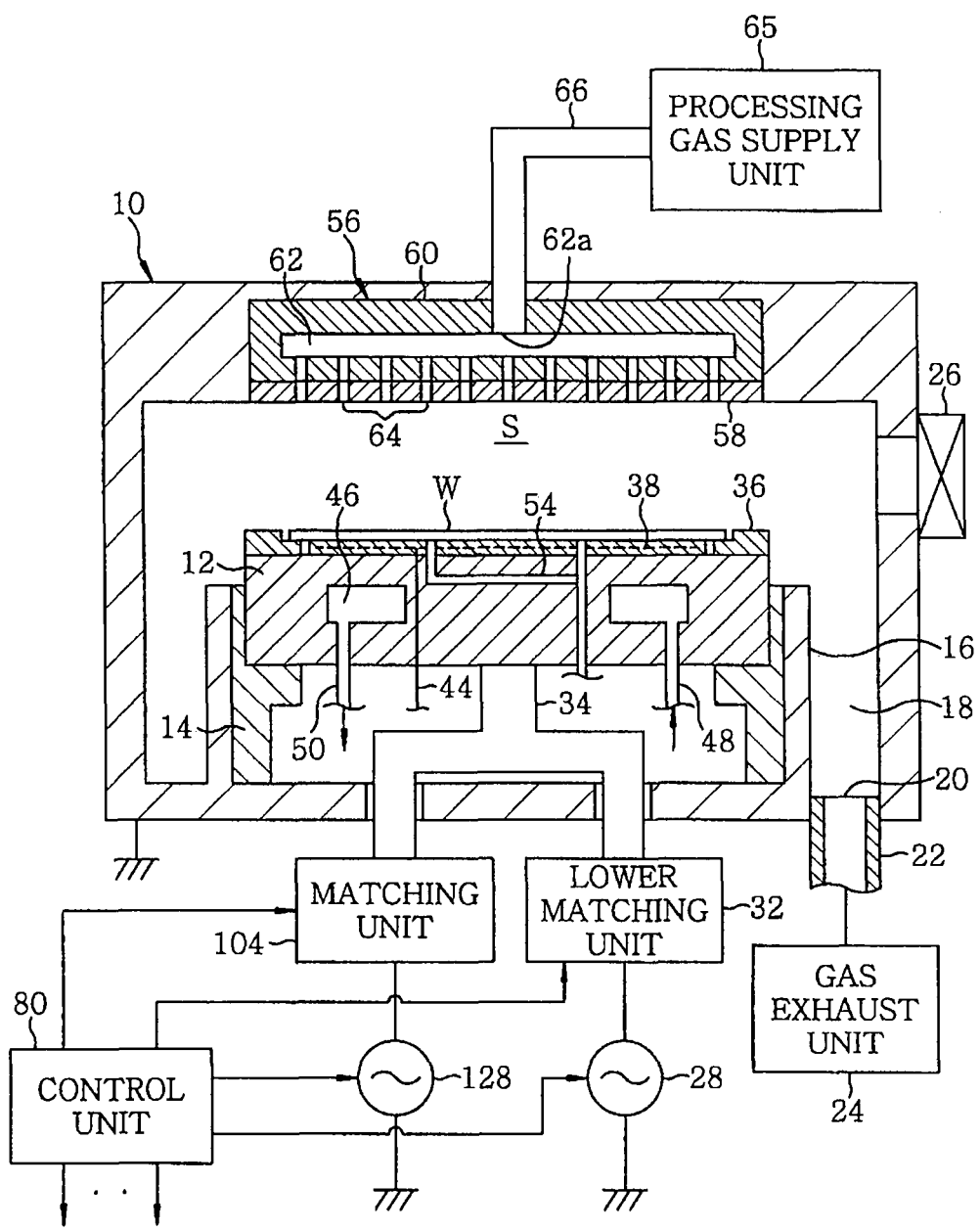
FIG. 14 represents a cross sectional view showing a configuration of a plasma etching apparatus in accordance with a second embodiment of the present invention.

FIG. 14 shows a configuration of a plasma processing apparatus in accordance with a second embodiment of the present invention. In FIG. 14, like reference numerals will be used for like parts identical to those of the apparatus of the first embodiment (FIG. 1).

This plasma processing apparatus is configured as a capacitively coupled plasma etching apparatus of a cathode couple type (lower electrode dual frequency application type) in which a radio frequency power for plasma generation and a radio frequency power for bias control are simultaneously supplied to the susceptor (lower electrode) 12. To be more specific, the radio frequency power supply 28 for generating a radio frequency LF for bias control is electrically connected to the susceptor 12 via the matching unit 32 and, also, the radio frequency power supply 128 for generating a radio frequency HF for plasma generation is electrically connected to the susceptor 12 via the matching unit 104. The upper electrode 56 is directly attached to the chamber 10, and is electrically grounded via the chamber 10.

In this plasma etching apparatus as well, the control unit 80 can perform the above dual pulse modulation of the radio frequency power LF for bias control via the radio frequency power supply 28 and the matching unit 32. In other words, the pulse modulation of the LF amplitude and the pulse modulation of the LF frequency can be performed together.

Meanwhile, the pulse modulation of the LF leads to the cyclic change of the lower sheath thickness and, hence, the HF plasma impedance from the susceptor 12 changes at a regular interval. As a consequence, the HF reflection power returning from the plasma to the radio frequency power supply 128 increases. The increase of the HF reflection power leads to the deterioration of the plasma density and the distribution characteristics thereof, and further causes the breakdown of the radio frequency power supply 128.

In the present embodiment, the pulse modulation of the HF amplitude and/or the HF frequency can be performed together with the LF pulse modulation. Although it is not illustrated, the radio frequency power supply 128 includes, as same as the radio frequency power supply 28, an oscillator with a variable frequency and a power amplifier with a variable amplification rate. Further, the control unit 80 performs the variable control and the pulse modulation of the HF frequency via the corresponding oscillator, and also performs the variable control and the pulse modulation of the HF amplitude via the corresponding power amplifier.

Moreover, a gate circuit is installed between the RF sensor and the controller in the matching unit 104, and transmits an output signal from the RF sensor to the controller only for a predetermined matching unit response period. Furthermore, a reflection wave measuring circuit (not shown) for measuring a power of an HF reflection wave transmitted through a transmission line from the load side to the output terminal of the radio frequency power supply 128 is installed. Therefore, various parameters related to the HF pulse modulation can be selected or controlled based on the measured reflection power received from the reflection wave measuring circuit.

In the apparatus of FIG. 1 of the upper and the lower plate dual frequency application type for supplying the plasma generation radio frequency power HF to the upper electrode 56, the control unit 80 can perform, as in the above embodiment, the pulse modulation of the HF amplitude and/or the HF frequency together with the LF pulse modulation via the radio frequency power supply 70 and the matching unit 74.

Figure 15:
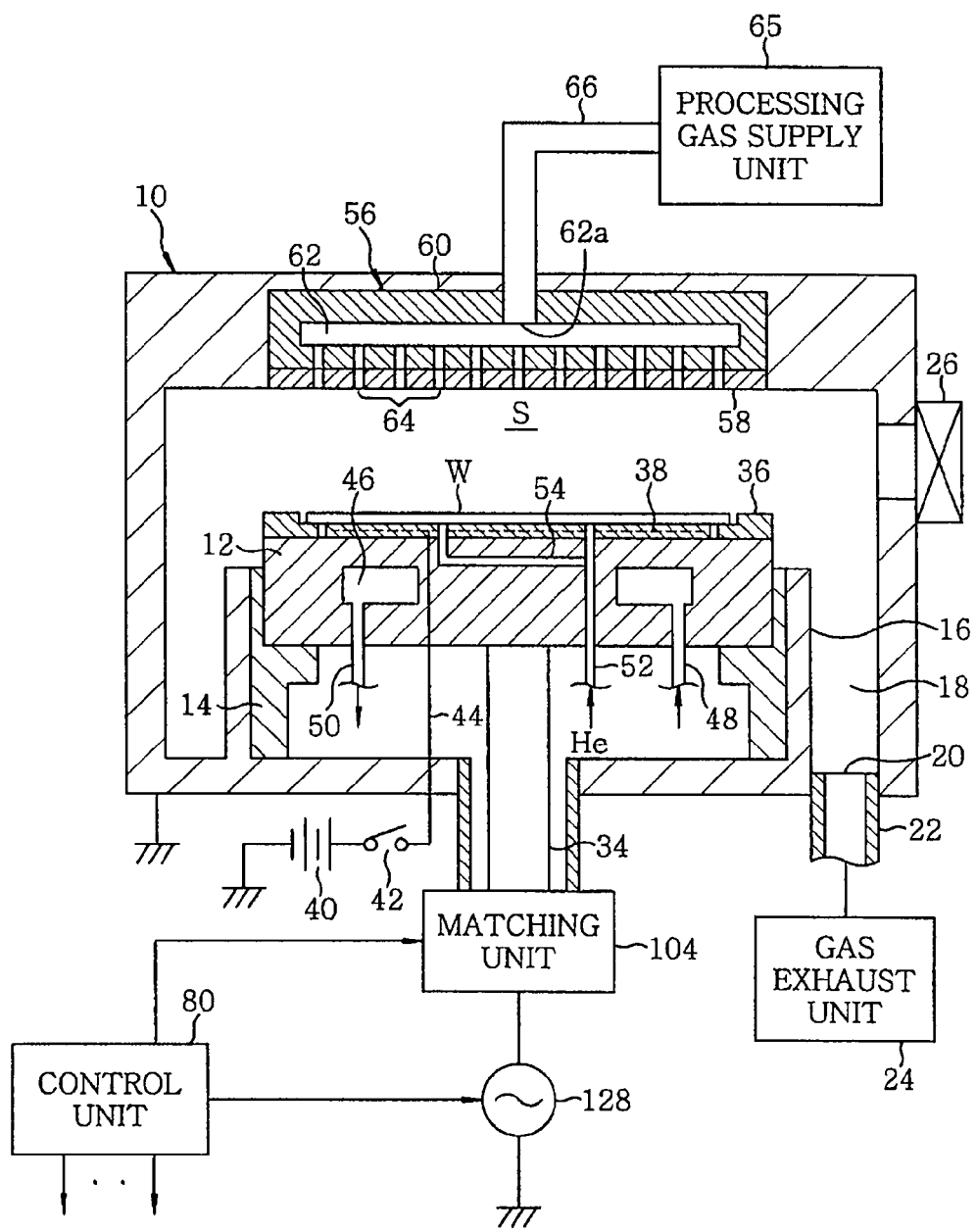
FIG. 15 sets forth a cross sectional view illustrating a configuration of a plasma etching apparatus in accordance with a third embodiment of the present invention.

FIG. 15 illustrates a configuration of a plasma processing apparatus in accordance with a third embodiment of the present invention. In FIG. 15, like reference numerals will be used for like parts identical to those of the apparatus of the first and second embodiments (FIGS. 1 and 14).

This plasma processing apparatus is configured as a capacitively coupled plasma etching apparatus of cathode-coupled type in which a radio frequency power for plasma generation is supplied to the susceptor (lower electrode) 12.

In this plasma etching apparatus, when the plasma density increases by outputting a radio frequency of about 40 MHz or higher from the radio frequency power supply 128, the ion energy decreases, i.e., the sheath potential on the semiconductor wafer W decreases (low bias). As the trend toward the low bias continues, the effect of charging damage (dielectric breakdown) cannot be ignored. The charging damage occurs when the amount of charges introduced from the plasma to the semiconductor wafer W (gate electrode) exceeds a predetermined threshold value. The amount of introduced charges varies depending on a relative difference of the sheath potential in the wafer W surface.

In a conventional plasma etching apparatus using a low frequency, a sheath potential has a high voltage of several hundreds of volts. Therefore, the change of the sheath potential in the wafer surface is relatively small despite the in-plane non-uniformity of a potential in a plasma (plasma potential). Further, the amount of charges introduced into a gate electrode of a semiconductor wafer does not exceed a threshold value.

However, in the present embodiment using a high-density plasma, a sheath potential has a low voltage of several tens of volts and, thus, the change of the sheath potential by the in-plane non-uniformity of the plasma potential is relatively large. Further, a large amount of electrons are easily introduced into the gate electrode, so that the charging damage occurs easily when the substrate surface is continuously exposed to the plasma over the elapsed time.

Moreover, during the plasma processing, the charge up may occur in an insulating film (e.g., gate oxide film) on the substrate due to local unbalance between ions and electrons which is caused by the in-plane non-uniformity of the plasma potential, the profile of the circuit pattern or the like. In the insulating film where the charge up occurs, an electric potential gradient or an electric field is generated in direct proportion to the amount of accumulated charges. When the charge up is accumulated and thus exceeds a threshold value, the insulating film can be damaged or broken.

In this embodiment, a plasma generation state and a plasma non-generation state (a state where a plasma is not generated) are alternately repeated so that the amount of charges introduced into the gate electrode does not exceed the threshold value and also the amount of charges accumulated in the insulating film does not exceed the threshold value. Namely, the continuous plasma generation time is set to be short enough that the amount of introduced charges and the amount of charged up charges do not exceed the threshold value and, then, the state where a plasma is not generated is continued.

By alternately repeating such two states, even if the excessive amount of charges are introduced or the charge up occurs in any location on the wafer W during the plasma generation state, excess charges or accumulated charges are distributed to a periphery thereof during the plasma non-generation state, thereby recovering neutral state. Accordingly, it is possible to suppress the increase of introduced charges or accumulated charges, and also possible to prevent the damage to the insulating film effectively. As a result, the reliability of the plasma processing can be greatly improved.

In order to alternately repeat the plasma generation state and the plasma non-generation state during the plasma etching, the control unit 80 of this embodiment controls the radio frequency power supply 128 and the matching unit 104 so as to alternately repeat at a predetermined interval a high level period during which the plasma generation radio frequency power HF has an amplitude or a peak value of a high level (effective power) which generates a plasma and an low level period during which the plasma generation radio frequency power HF has an amplitude or a peak value of an low level (no effective power) which generates no plasma.

Figure 16:
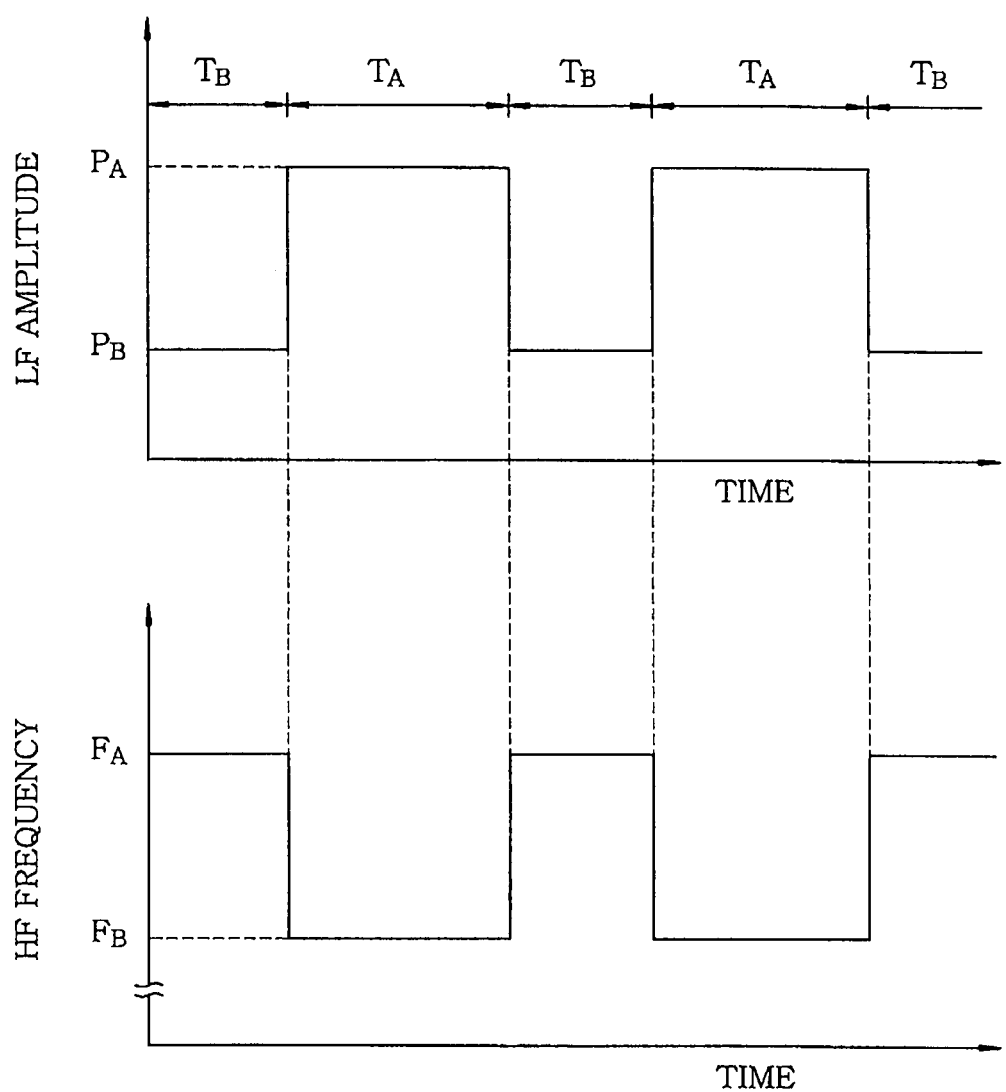
FIG. 16 is a waveform diagram for explaining a basic technique of a pulse modulation method in accordance with the third embodiment.

FIG. 16 describes a basic technique of a pulse modulation method of the present embodiment. In this embodiment, the pulse modulation of the HF frequency is carried out together with the pulse modulation of the HF amplitude.

To be more specific, during one cycle between the HF amplitude and the HF frequency, the HF frequency maintains the low level set value $F_B$ (e.g., a reference value of 60 MHz) during the period $T_A$ at which the HF amplitude maintains the high level set value $P_A$ (e.g., about 500 W), and the HF frequency maintains the high level set value $F_A$ (e.g., a reference value of 62.45 MHz) during the period $T_B$ during which the HF amplitude maintains the low level set value $P_B$ (e.g., about 100 W), which establishes the synchronization relationship. In this case as well, the high level and the low level of the HF frequency indicate relative high and low levels of two different frequency set values, wherein the high level and the low level represent a set value of a comparatively higher frequency and a set value of a comparatively lower frequency, respectively.

In the capacitively coupled apparatus, the plasma capacitance is larger when a plasma exists between the upper electrode and the lower electrode than when no plasma exists therebetween. Further, as the plasma density increases, the plasma capacitance increases. In other words, the plasma capacitance is greater when the HF is supplied than when the HF is not supplied. Moreover, as the HF amplitude increases, the plasma capacitance increases.

Since the pulse modulation of the opposite-phase of the HF frequency is carried out at the same time as the pulse modulation of the HF amplitude, it is possible to avoid the regular change of the plasma capacitance due to the pulse modulation of the HF amplitude by the frequency variable control, and also possible to suppress the abrupt change of the plasma impedance.

Hence, in the pulse modulation method of the present embodiment, the impedance matching is performed between the radio frequency power supply 128 and the load by the automatic matching function of the lower matching unit 32 during the high level period $T_A$. During the low level period $T_B$, the lower matching unit 32 does not respond to the load impedance and, instead, the LF frequency is decreased by the radio frequency power supply 128 to correct the impedance mismatching. Therefore, even if the capacitance of the lower sheath changes at a regular interval due to the regular change in the LF amplitude between the high level and the low level, the plasma impedance or the load impedance does not sharply change. Therefore, the hunting phenomenon during the automatic matching of the lower matching unit 32 does not occur, and the reflection from the load (especially, the plasma) to the radio frequency power supply 28 can be effectively suppressed.

Further, in the plasma etching apparatus (FIG. 14) of the lower electrode dual frequency application type described in the second embodiment, the plasma generation radio frequency power HF can be pulse modulated in the manner described in the third embodiment.

In addition, although it is not illustrated, even in the anode coupled plasma processing apparatus in which the plasma generation radio frequency power HF is supplied to the upper electrode, the HF can be pulse modulated in the manner described in the third embodiment.

While the invention has been shown and described with respect to the embodiments, it will be understood by those skilled in the art that various changes and modification may be made.

For example, in the above embodiment, the matching unit response period is set within a period during which the radio frequency power amplitude to be pulse modulated maintains the high level set value (amplitude high level period) $T_A$, and the impedance matching is performed during the amplitude high level period $T_A$. However, when the duty is small, i.e., when the rate of the amplitude high level period $T_A$ is smaller compared to that of the amplitude low level period $T_B$ in one cycle, the matching unit response period can be set within the amplitude low level period $T_B$, and the impedance matching can be performed during the amplitude low level period $T_B$.

FIG. 17 shows a configuration example of the control unit 80 for controlling an entire sequence and an operation of each unit in the plasma processing apparatus (see FIGS. 1, 14 and 15) for performing the plasma etching method of the above embodiment.

The control unit 80 of the configuration example includes a processor (CPU) 152 connected thereto via a bus 150, a memory (RAM) 154, a program storage unit (HDD) 156, a disk drive (DRV) 158 such as a floppy drive, an optical disk or the like, an input device (KEY) 160 such as a keyboard, a mouse or the like, a display device (DIS) 162, a network interface (COM) 164 and a peripheral interface (I/F) 166.

The processor (CPU) 152 reads a code of a required program from the storage medium 168 such as a floppy disk (FD), an optical disk or the like installed in the disk drive (DRV) 158, and stores the read code in the HDD 156. Or, a required program may be downloaded from a network via the network interface 164. Further, the processor (CPU) 152 loads a program required to each step or each moment from the HDD 156 into the working memory (RAM) 154 and performs each step of the program while processing required operation so that, each unit in the apparatus (especially, the gas exhaust unit 24, the radio frequency power supplies 28, 70 and 128, the matching units 32, 74 and 104, the processing gas supply unit 65, and the like) is controlled via the peripheral interface 166. The program for performing the plasma etching method of the above embodiment is executed in this computer system.

In the above embodiment, the present invention is applied to a capacitively coupled plasma processing apparatus for generating a plasma by a radio frequency discharge between parallel plate electrodes in a chamber. However, the present invention may also be applied to an inductively coupled plasma processing apparatus in which a plasma is generated under an induced magnetic field by using an antenna provided on top of or around the chamber, a microwave plasma processing apparatus for generating a plasma by using a microwave power, and the like.

The present invention is not limited to the plasma etching apparatus, and may be applied to other plasma processing apparatus for performing plasma CVD, plasma oxidation, plasma nitrification, sputtering and the like. Further, as for a target substrate, the present invention may use various substrates for flat panel display, a photomask, a CD substrate, a printed circuit board or the like other than a semiconductor wafer.

In accordance with the plasma processing apparatus or the plasma processing method or the computer readable storage medium of the present invention, due to the aforementioned configurations and operations, it is possible to minimize the impedance change of the ion sheath or the plasma and the reflection wave to the radio frequency power supply even if the amplitude of the radio frequency power used for plasma processing is modulated at the regular interval to obtain desired process characteristics, thereby ensuring the stability and the reproducibility of the process and the protection of the radio frequency power supply.

While the invention has been shown and described with respect to the embodiments, it will be understood by those skilled in the art that various changes and modification may be made without departing from the scope of the invention as defined in the following claims.

What is claimed is:

1. A plasma processing apparatus comprising:
a vacuum evacuable processing chamber;
a processing gas supply unit for supplying a processing gas into the processing chamber;
a first radio frequency power supply unit for supplying a first radio frequency power to a first electrode or to an antenna provided inside or near the processing chamber to generate a plasma by exciting the processing gas in the processing chamber; and
a control unit configured to control the first radio frequency power supply unit such that an amplitude of the first radio frequency power is modulated at a predetermined interval and a frequency of the first radio frequency power is modulated in substantially synchronously with the amplitude modulation of the first radio frequency power,
wherein the control unit is configured to divide one cycle into a first, a second, a third and a fourth state, and control the amplitude of the first radio frequency power to maintain a first amplitude set value in the first state, change from the first amplitude set value to a second amplitude set value higher than the first amplitude set value in the second state, maintain the second amplitude set value in the third state, and change from the second amplitude set value to the first amplitude set value in the fourth state,
wherein the control unit is configured to control the frequency of the first radio frequency power to maintain a first frequency set value in the first state, change from the first frequency set value to a second frequency set value lower than the first frequency set value in the second state, maintain the second frequency set value in the third state, and change from the second frequency set value to the first frequency set value in the fourth state,
wherein the first radio frequency power supply unit includes:
a first radio frequency power supply for generating the first radio frequency power; and
a matching unit having a matching circuit equipped with variable reactance elements electrically connected between an output terminal of the first radio frequency power supply and the first electrode; a sensor equipped with the matching circuit, for measuring a load impedance; and a controller for varying the variable reactance elements so as to match the load impedance to a reference impedance in response to an output signal from the sensor,
wherein the control unit is configured to control the matching unit to perform impedance matching in either the first state or the third state,
wherein the control unit is configured to feedback the output signal from the sensor to the controller only for a predetermined period set during the first state or the third state,
wherein the first radio frequency power supply unit further includes a reflection wave measuring unit for measuring a power of a reflection wave transmitted on a transmission line from the first electrode to the first radio frequency power supply, wherein the control unit is configured to correct the first amplitude set value based on the reflection wave power measured by the reflection wave measuring unit during the first state to determine a corrected first amplitude set value so that the corrected first amplitude set value is used for the first state of a subsequent cycle, and wherein the control unit is configured to correct the second amplitude set value based on the reflection wave power measured by the reflection wave measuring unit during the third state to determine a corrected second amplitude set value so the corrected second amplitude set value is used for the third state of a subsequent cycle.

2. The plasma processing apparatus of claim 1, wherein the control unit feedbacks the output signal from the sensor to the controller only for a predetermined period set during the third state.

3. The plasma processing apparatus of claim 1, wherein the control unit selects the first radio frequency set value so that the reflection wave power measured by the reflection wave measuring unit during the first state becomes minimum or a value close thereto.

4. The plasma processing apparatus of claim 1, wherein the control unit feedbacks the output signal from the sensor to the controller only for a predetermined period set during the first state.

5. The plasma processing apparatus of claim 1, wherein the control unit selects the third radio frequency set value so that the reflection wave power measured by the reflection wave measuring unit during the third state becomes minimum or a value close thereto.

6. The plasma processing apparatus of claim 1, wherein the control unit changes the amplitude of the first radio frequency power from the first amplitude set value to the second amplitude set value in accordance with predetermined increasing characteristics, and changes the frequency of the first radio frequency power from the first frequency set value to the second frequency set value in accordance with predetermined decreasing characteristics so that the reflection wave power measured by the reflection wave measuring unit during the second state becomes minimum or a value close thereto.

7. The plasma processing apparatus of claim 1, wherein the control unit changes the amplitude of the first radio frequency power from the second amplitude set value to the first amplitude set value in accordance with predetermined decreasing characteristics, and changes the frequency of the first radio frequency power from the second frequency set value to the first frequency set value in accordance with predetermined increasing characteristics so that the reflection wave power measured by the reflection wave measuring unit during the fourth state becomes minimum or a value close thereto.

8. The plasma processing apparatus of claim 1, wherein the reflection wave power measured by the reflection wave measuring unit is defined as a moving average.

9. A plasma processing apparatus according to claim 1, wherein:
the control unit is configured to determine the corrected first amplitude set value based on the reflection wave power measured by the reflection wave measuring unit during the first state and a first state load power target value; and
the control unit is configured to determine the corrected second amplitude set value based on the reflection wave power measured by the reflection wave measuring unit during the third state and a third state load power target value.

* * * * *